United States Patent
Wu

(10) Patent No.: US 6,667,510 B2
(45) Date of Patent: Dec. 23, 2003

(54) SELF-ALIGNED SPLIT-GATE FLASH MEMORY CELL AND ITS CONTACTLESS MEMORY ARRAY

(75) Inventor: Ching-Yuan Wu, Hsinchu (TW)

(73) Assignee: Silicon Based Technology Corp., Hsinchu (TW)

( * ) Notice: Subject to any disclaimer, the term of this patent is extended or adjusted under 35 U.S.C. 154(b) by 2 days.

(21) Appl. No.: 10/076,671

(22) Filed: Feb. 19, 2002

(65) Prior Publication Data

US 2003/0156460 A1 Aug. 21, 2003

(51) Int. Cl.⁷ ............................................... H01L 29/76
(52) U.S. Cl. ...................... 257/319; 257/315; 257/316; 257/317
(58) Field of Search ................................ 257/319, 315, 257/316, 317; 365/185.14, 185.15, 185.16

(56) References Cited

U.S. PATENT DOCUMENTS

| | | | |
|---|---|---|---|
| 5,654,917 A | | 8/1997 | Ogura et al. |
| 5,745,417 A | | 4/1998 | Kobayashi et al. |
| 6,009,013 A | | 12/1999 | Van Houdt et al. |
| 6,130,839 A | | 10/2000 | Chang |
| 6,133,098 A | | 10/2000 | Ogura et al. |
| 6,525,369 B1 | * | 2/2003 | Wu ............................. 257/315 |
| 6,528,843 B1 | * | 3/2003 | Wu ............................. 257/315 |
| 6,531,734 B1 | * | 3/2003 | Wu ............................. 257/315 |
| 6,552,386 B1 | * | 4/2003 | Wu ............................. 257/317 |
| 6,570,213 B1 | * | 5/2003 | Wu ............................. 257/315 |

OTHER PUBLICATIONS

Seiichi Aritome, Advanced Flash Memory Technology and Trends for File Storage Application, pp. 2–9, IEEE (2000).
Dry Etching Various Types of Thin Films, pp. 22–25.
Manufacturing Methods, pp. 11–20.

* cited by examiner

*Primary Examiner*—Richard Elms
*Assistant Examiner*—Douglas Menz
(74) *Attorney, Agent, or Firm*—Pro-Techtor International Services

(57) ABSTRACT

A self-aligned split-gate flash memory cell and its contactless memory array in which a floating-gate length and a control-gate length of a self-aligned split-gate flash memory cell are separately defined by two sidewall dielectric spacers being formed over the same sidewall on a common-source region and, therefore, can be controlled to be smaller than a minimum-feature-size of technology used; a contactless memory array includes a plurality of common-source/drain conductive bus lines being formed alternately over the first/second flat beds; and a plurality of word lines together with the control-gates of a plurality of self-aligned split-gate flash memory cells being patterned and etched simultaneously by a set of hard masking layers are formed transversely to the plurality of common-source/drain conductive bus lines.

14 Claims, 14 Drawing Sheets

SELF-ALIGNED SPLIT-GATE FLASH MEMORY CELL AND ITS CONTACTLESS MEMORY ARRAY

FIELD OF THE INVENTION

The present invention relates generally to a non-volatile semiconductor memory device and, more particularly, to a self-aligned split-gate flash memory cell and its contactless memory array for mass storage applications.

DESCRIPTION OF RELATED ART

A semiconductor memory array is in general arranged in a matrix form with a plurality of bit lines being formed transversely to a plurality of word lines. Basically, the binary data are stored in a memory element as is called a cell, the basic logic function is used to implement an array architecture. For a flash memory array, the memory element in a matrix is often configured to be a NOR-type or a NAND-type. Based on the cell structure, the flash memory cells of the prior arts can be basically divided into two categories: a stack gate structure and a split-gate structure.

The stack-gate flash memory cell is known to be a one-transistor cell, in which the gate length of a cell can be defined by using a minimum-feature-size (F) of technology used. Therefore, the stack-gate flash memory cell is often used in existing high-density memory system. The stack-gate flash memory cells can be interconnected in series to form a high-density NAND-type array with common source/drain diffusion regions. However, the read speed is relatively slow for a NAND-type array due to the series resistance of the configuration. Moreover, a NAND-type flash memory cell is programmed by Fowler-Nordheim tunneling across the thin tunneling-oxide layer between the floating-gate and the common source/drain diffusion region and its programming speed is relatively slow. In addition, when the gate length of a stack-gate flash memory cell in a NAND-type array is further scaled down, the junction depth of common-source/drain diffusion regions must be scaled accordingly, and the overlapped region between the floating gate and the common-source/drain diffusion region becomes smaller, resulting in a further slow process for programming, reading and erasing.

The stack-gate flash memory cells can be connected with common-source diffusion lines and the drain diffusion regions in each column being connected to a bit line through contacts for a NOR-type flash memory array. The read speed of a NOR-type flash memory array is much faster as compared to that of a NAND-type flash memory array. A stack-gate flash memory cell in a NOR-type flash memory array is in general programmed by channel hot-electron injection and its programming speed is much faster than that of a NAND-type flash memory array; however, the programming power is large and the programming efficiency is low. The erasing speed of a NOR-type flash memory array is quite similar to that of a NAND-type flash memory array and is limited by Fowler-Nordheim tunneling across the thin tunneling-oxide layer between the floating-gate and the common-source diffusion line; however, the over-erase problem needs a complex circuitry to do verification. Moreover, as the gate length of a stack-gate flash memory cell is further scaled, the punch-through effect becomes a major concern for channel hot-electron injection as a programming method. In addition, the cell size of a NOR-type flash memory array is about twice that of a NAND-type flash memory array due to the bit-line contact. Therefore, the contactless flash memory array by taking advantages of a NOR-type flash memory array becomes a major trend of technology development.

FIG. 1 shows a typical contactless flash memory array, in which a plurality of bit lines (BL0~BL6) are formed by using the common buried diffusion lines; the stack-gate flash memory cells (100~129) in each column are arranged between the bit lines; the control-gates in each row are connected to form a word line (WL); and a plurality of word lines are perpendicular to the plurality of bit lines. It is clearly seen that the cell size of FIG. 1 can be made to be comparable with that of a NAND array due to the contactless structure used; the read speed of FIG. 1 is better than that of a NAND array and is inferior to that of a NOR-type array due to the larger bit-line capacitance with respect to the semiconductor substrate. Since the stack-gate structure in the channel-width direction must be etched to have an independent floating-gate for each cell, elaborate engineering works must be done without trenching the buried diffusion bit lines and the semiconductor substrate between the word lines. Moreover, the isolation of cells between the neighboring word lines is performed by ion-implantation, resulting in the further increase of the bit-line capacitance and the reduction of cell width. Similarly, the gate length of the stack-gate flash memory cell is difficult to be scaled down due to the punch-through effect and the junction depth of the buried bit-line diffusion region can't be easily scaled without increasing the bit-line resistance and decreasing the erasing speed. A typical example for implementing a high-density memory array shown in FIG. 1 may refer to U.S. Pat. No. 5,654,917, in which a high parasitic capacitance between the word lines and the bit lines can be observed.

SUMMARY OF THE INVENTION

A self-aligned split-gate flash memory cell of the present invention is formed on a shallow-trench-isolation (STI) structure being formed on a semiconductor substrate of a first conductivity type. The shallow-trench-isolation structure comprises an active region being formed between two parallel STI regions, in which a first conductive layer being formed on a thin tunneling-dielectric layer is located in the active region and the raised filed-oxide (FOX) layer is formed on each of parallel STI regions. A self-aligned split-gate flash memory cell can be divided into three regions: a common-source region, a gate region, and a common-drain region, in which the gate region is located between the common-source region and the common-drain region. The gate region comprises a control-gate with its gate length being defined by a sidewall dielectric spacer formed over a sidewall of the common-source region and is further divided into two sub-regions: a floating-gate region and a select-gate region, in which the floating-gate region comprises a floating-gate transistor being formed on a thin tunneling-dielectric layer with a floating-gate length being defined by a sidewall dielectric spacer formed over the same sidewall of the common-source region; the select-gate region comprises a select-gate transistor being formed on a gate-dielectric layer and is located near the common-drain region. The floating-gate transistor comprises an intergate dielectric layer being formed over the floating-gate and a nitrided thermal poly-oxide layer being formed over a sidewall to separate from the control-gate. The floating-gate length being defined by a sidewall dielectric spacer can be etched to form a steep floating-gate structure or a one-side tapered floating-gate structure and the nitrided thermal poly-oxide layer being formed over the sidewall can be acted as a tunneling-dielectric layer for erasing the stored electrons in the floating-gate to the control-gate. An implanted region being formed under the gate-dielectric layer of the select-gate transistor comprises a shallow implant region of a first conductivity type for threshold-voltage adjustment of the select-gate transistor and a deep implant region of a first conductivity type for forming a punch-through stop. The common-source region comprises a common-source diffusion region of a second conductivity type being implanted with doping impurities in a self-aligned manner into a semiconductor substrate of the active region, a first flat bed being formed by a common-source diffusion region and the first etched raised field-oxide layers, a first sidewall dielectric spacer being formed over a sidewall of the gate region and on a portion of the first flat bed, a common-source conductive bus line capped with a first metal-silicide layer being formed over the first flat bed outside of the first sidewall dielectric spacer, and a first planarized thick-oxide layer being formed over the first sidewall dielectric spacer and the first metal-silicide layer. The common-drain region comprises a common-drain diffusion region of a second conductivity type being implanted with doping impurities in a self-aligned manner into a semiconductor substrate of the active region, a second flat bed being formed by a common-drain diffusion region and the second etched raised field-oxide layers, a second sidewall dielectric spacer being formed over a sidewall of the gate region and on a portion of the second flat bed, a common-drain conductive bus line capped with a second metal-silicide layer being formed over the second flat bed outside of the second sidewall dielectric spacer, and a second planarized thick-oxide layer being formed over the second sidewall dielectric spacer and the second metal-silicide layer. The control gate together with a first interconnect metal layer being acted as a word line is patterned transversely to the common-source/drain conductive bus line and etched simultaneously by a hard masking layer being formed by a masking dielectric layer being aligned above the active region and its two sidewall dielectric spacers.

A contactless self-aligned split-gate flash memory array of the present invention comprises a plurality of parallel shallow-trench-isolation (STI) regions and a plurality of active regions being formed alternately on a semiconductor substrate of a first conductivity type, and each of the plurality of parallel STI regions is filled with a raised field-oxide layer; a plurality of virtual gate regions and a plurality of common-source regions being alternately formed by a masking photoresist step and being transversely to the plurality of parallel STI regions, and each of the plurality of virtual gate regions is divided into three regions: two self-aligned split-gate regions being located in each side portion and a common-drain region being located between the self-aligned split-gate regions; and a plurality of word lines being formed transversely to the plurality of common-source/drain regions and above the plurality of active regions, and each of the plurality of word lines being connected to the control-gates of the self-aligned split-gate regions in a row. The self-aligned split-gate region comprises a plurality of self-aligned split-gate flash memory cells in a column, and each of the plurality of self-aligned split-gate flash memory cells being aforementioned. Each of the plurality of common-source regions comprises a plurality of common-source diffusion regions of a second conductivity type being formed by implanting doping impurities in a self-aligned manner into the semiconductor substrate of the plurality of active regions along the common-source region; a first flat bed being formed alternately by a common-source diffusion region and a first etched raised field-oxide layer; a pair of first sidewall dielectric spacers being formed over the sidewalls of the neighboring virtual gate regions and on a portion of the first flat bed; a common-source conductive bus line is formed over the first flat bed between the pair of first sidewall dielectric spacers; a first metal-silicide layer is formed over the common-source conductive bus line; and a first planarized thick-oxide layer is formed over the first metal-silicide layer and the pair of first sidewall dielectric spacers. The common-drain region comprises a plurality of common-drain diffusion regions of a second conductivity type being formed by implanting doping impurities in a self-aligned manner into the semiconductor substrate of the plurality of active regions along the common-drain region; a second flat bed being formed alternately by a common-drain diffusion region and a second etched raised field-oxide layer; a pair of second sidewall dielectric spacers are formed over the sidewalls of the neighboring self-aligned split-gate regions and on a portion of the second flat bed; a common-drain conductive bus line is formed over the second flat bed between the pair of second sidewall dielectric spacers, a second metal-silicide layer is formed over the common-drain conductive bus line; and a second planarized thick-oxide layer is formed over the second metal-silicide layer and the pair of second sidewall dielectric spacers. Each of the plurality of word lines comprises a first interconnect metal layer being integrated with a plurality of control-gates in a row and is patterned and etched simultaneously with the plurality of control-gates by a hard masking layer being formed by a masking dielectric layer being aligned to the active region and its two sidewall dielectric spacers.

BRIEF DESCRIPTION OF THE DRAWINGS

FIG. 2A through FIG. 2G show the schematic diagrams of a self-aligned split-gate flash memory cell and its contactless memory array of the present invention, in which FIG. 2A shows a schematic circuit diagram of a contactless self-aligned split-gate flash memory array of the present invention; FIG. 2B shows a top plan view of a contactless self-aligned split-gate flash memory array of the present invention; FIG. 2C(a) shows a cross-sectional view of a self-aligned split-gate flash memory cell having a steep floating-gate structure along A–A' direction shown in FIG. 2B; FIG. 2C(b) shows a cross-sectional view of a self-aligned split-gate flash memory cell having a one-side tapered floating-gate structure along A–A' direction shown in FIG. 2B; FIG. 2D shows a cross-sectional view along B–B' direction shown in FIG. 2B; FIG. 2E shows a cross-sectional view along C–C' direction shown in FIG. 2B; FIG. 2F shows a cross-sectional view along D–D' direction shown in FIG. 2B; and FIG. 2G shows a cross-sectional view along E–E' direction shown in FIG. 2B.

DETAILED DESCRIPTION OF THE PREFERRED EMBODIMENTS

Figure 1:
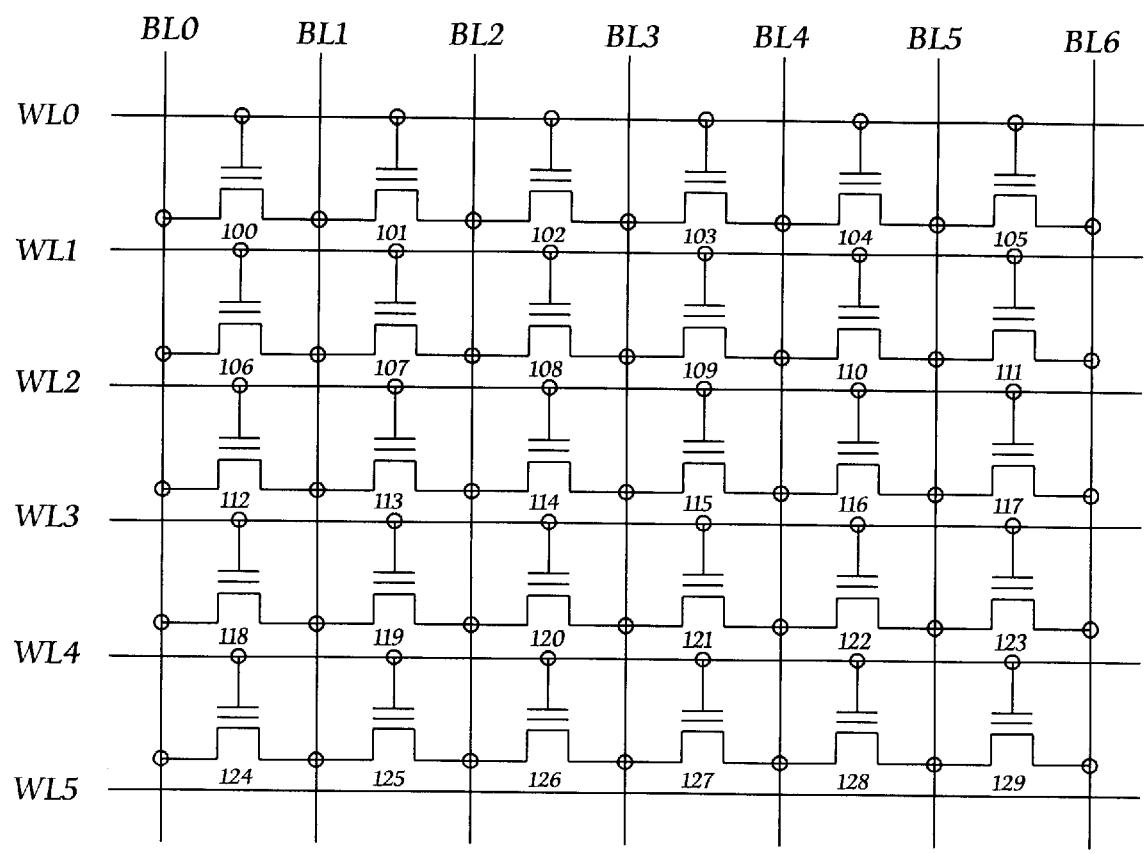
FIG. 1 shows a schematic circuit diagram of a stack-gate flash memory array of the prior art.
Figure 2A:
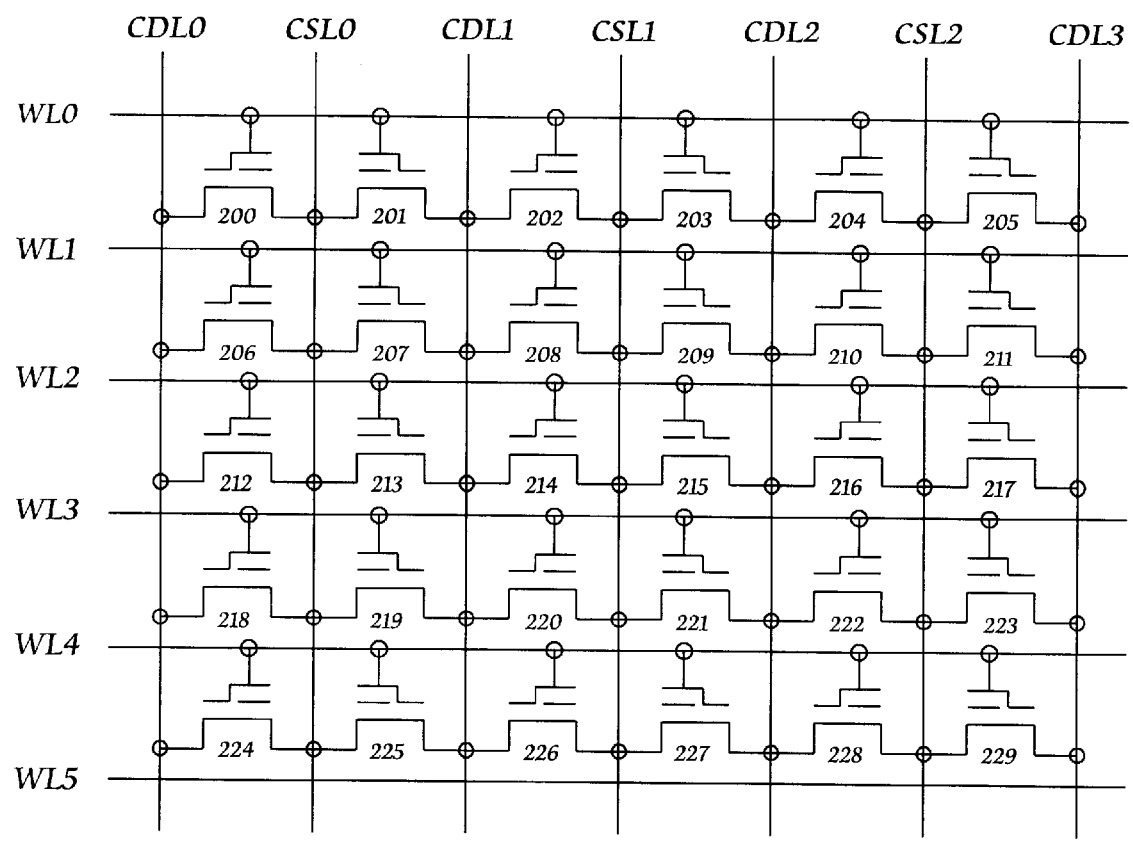

Referring now to FIG. 2A, there is shown a schematic circuit diagram of a contactless self-aligned split-gate flash memory array of the present invention, in which a plurality of common-source conductive bus lines (CSL0~CSL2) and a plurality of common-drain conductive bus lines (CDL0~CDL3) are formed alternately; a plurality of paired self-aligned split-gate flash memory cells are formed between the neighboring common-source conductive bus lines and a common-drain conductive bus line is formed between the plurality of paired self-aligned split-gate flash memory cells, and the floating-gates of the plurality of paired self-aligned split-gate flash memory cells are separately faced to the neighboring common-source conductive bus lines; a plurality of word lines are formed transversely to the plurality of common-source/drain conductive bus lines with the control-gates of the plurality of paired self-aligned split-gate flash memory cells in a row being connected to a word line.

Figure 2B:
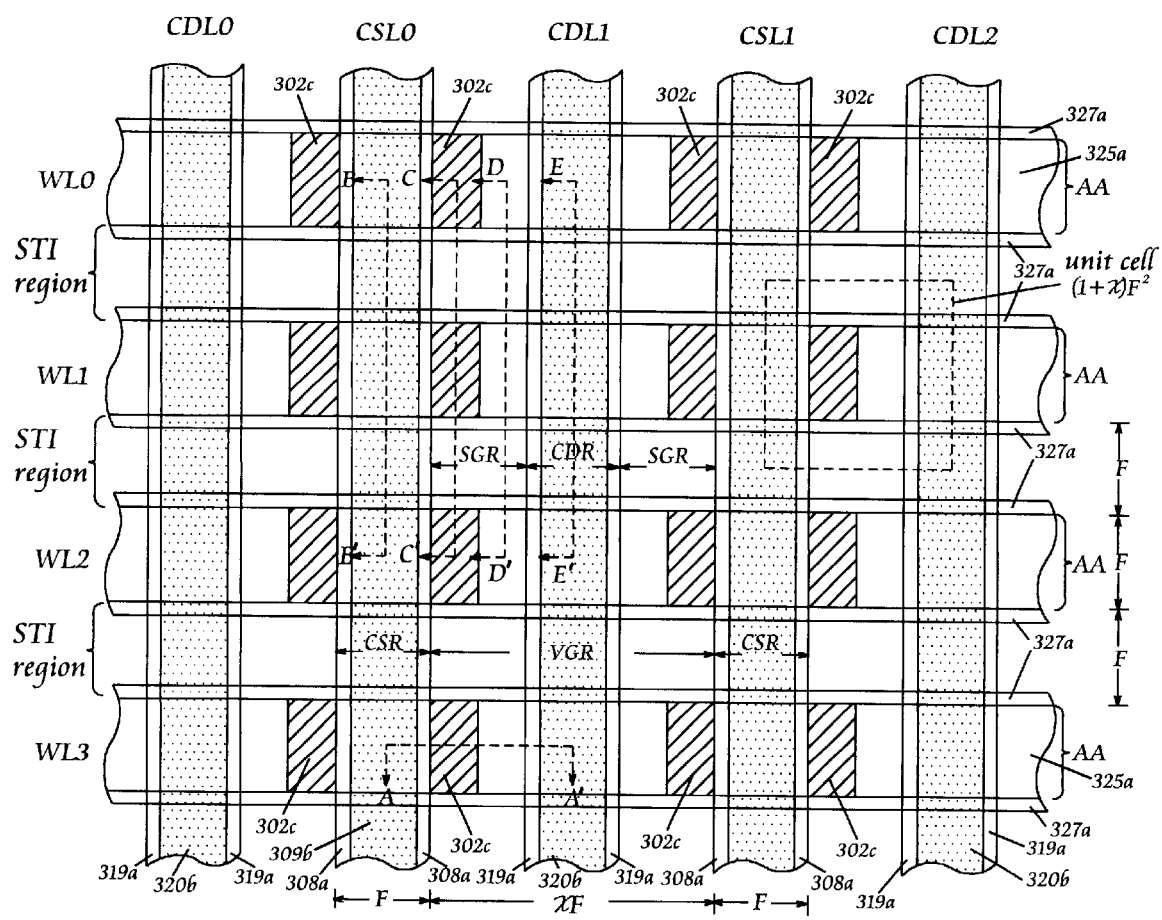

FIG. 2B shows a top plan view of a contactless self-aligned split-gate flash memory array of the present invention. As shown in FIG. 2B, a plurality of parallel shallow-trench-isolation (STI) regions and a plurality of active regions (AA) are formed alternately on a semiconductor substrate 300 of a first conductivity type, and each of the plurality of STI regions is filled with a raised field-oxide layer 304a; a plurality of common-source regions (CSR) and a plurality of virtual gate regions (VGR) are alternately formed and are transversely to the plurality of parallel STI regions, in which each of the plurality of virtual gate regions (VGR) is defined by a masking photoresist step with a scalable width XF and each of the plurality of common-source regions (CSR) is defined to have a width F; each of the plurality of virtual gate regions (VGR) comprises two self-aligned split-gate regions (SGR) being separately located in each side portion and a common-drain region (CDR) being located between the self-aligned split-gate regions (SGR); and a plurality of word lines (WL0~WL3) being located transversely to the plurality of common-source/drain regions are formed above the plurality of active regions with each of the plurality of word lines being connected to the control-gates of self-aligned split-gate regions (SGR) in each row. More detailed cross-sectional structure can be seen from FIG. 2C through FIG. 2G as will be discussed below.

Figure 2C:
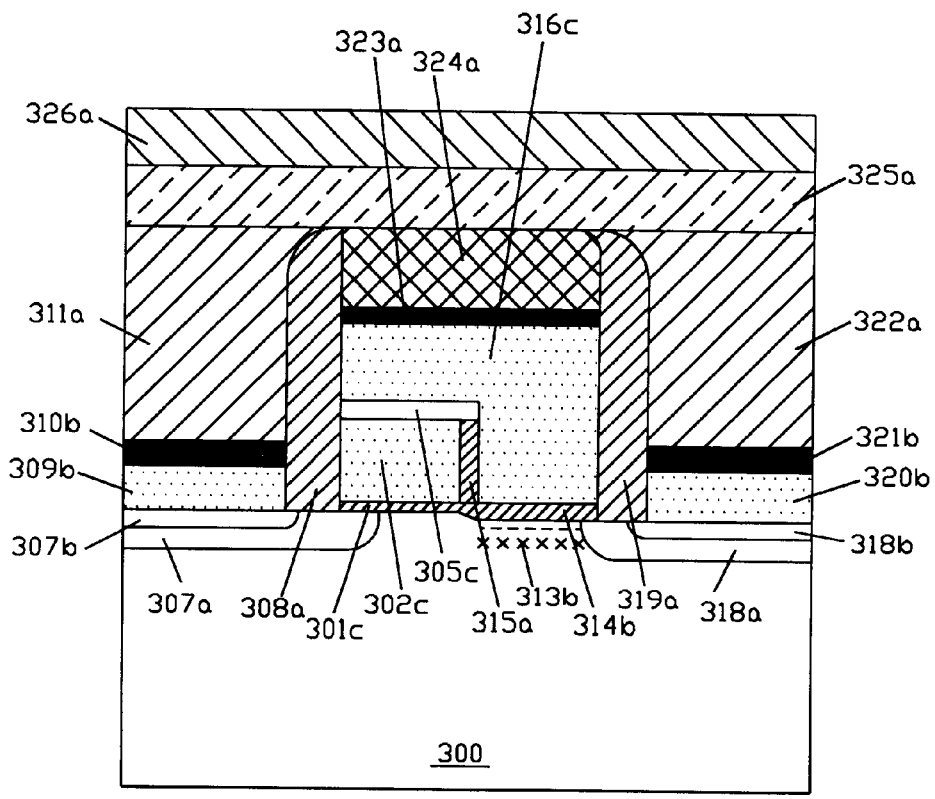
Figure 2C:
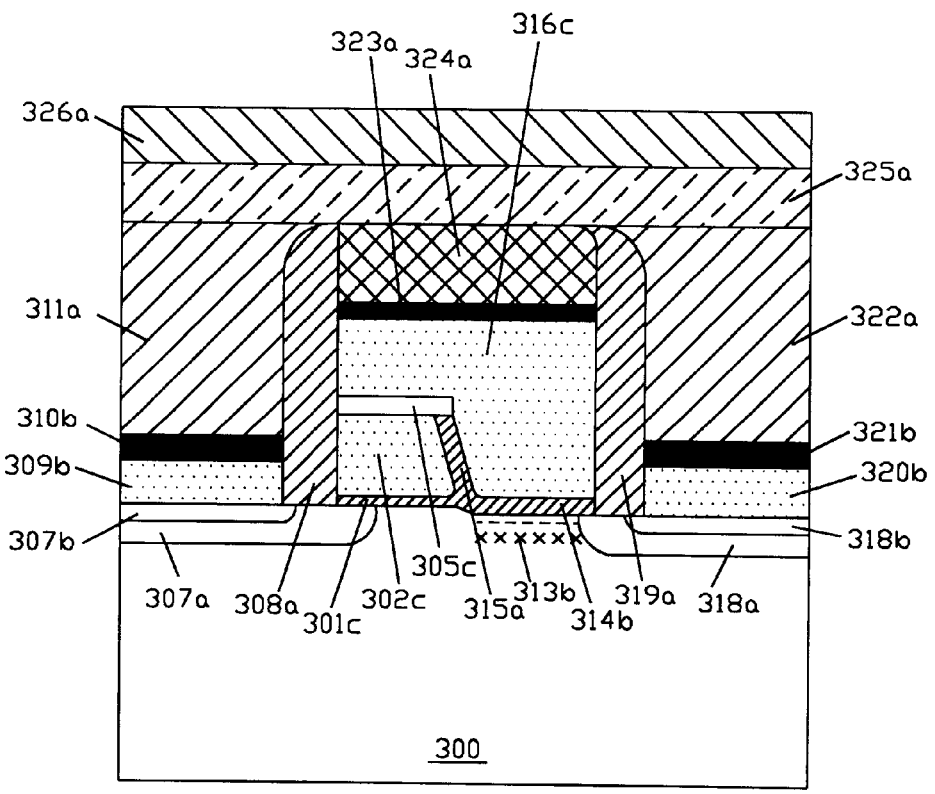

FIG. 2C shows a cross-sectional view along A–A' direction shown in FIG. 2B, in which FIG. 2C(a) shows a cross-sectional view of a self-aligned split-gate cell with a steep floating-gate structure and FIG. 2C(b) shows a cross-sectional view of a self-aligned split-gate cell with a one-side tapered floating-gate structure. From FIG. 2C(a) and FIG. 2C(b), a common-source region comprises a common-source diffusion region of a second conductivity type having a shallow heavily-doped diffusion region 307b formed within a deeper lightly-doped diffusion region 307a, a pair of first sidewall-dielectric spacers 308a (see FIG. 2B) being formed over each sidewall of the neighboring virtual gate regions and on a portion of a first flat bed being formed alternately by a common-source diffusion region and a first etched raised field-oxide layer 304c (see FIG. 2D), a common-source conductive bus line 309b capped with a first metal-silicide layer 310b being formed on the first flat bed between the pair of first sidewall dielectric spacers 308a, and a first planarized thick-oxide layer 311a being formed over the first metal-silicide layer 310b and the pair of first sidewall dielectric spacers 308a. The self-aligned split-gate region (SGR) comprises a composite control-gate being consisting of a planarized conductive control-gate 316c capped with a third metal-silicide layer 323a and a metal layer 324a, and is divided into two subregions: a floating-gate transistor region and a select-gate transistor region. The floating-gate transistor region comprises a steep (or one-side tapered) floating-gate layer 302c being formed on a thin tunneling-dielectric layer 301c, an intergate dielectric layer 305c being formed on the steep (or one-side tapered) floating-gate layer 302c, and a thermal poly-oxide layer 315a being formed over the sidewall of the steep (or one-side tapered) floating-gate layer 302c. The select-gate transistor region comprises a gate-dielectric layer 314b and an implanted region 313b of a first conductivity type having a shallow implant region (as marked by dash lines) for threshold-voltage adjustment and a deep implant region (as marked by cross symbols) for forming a punch-through stop. The common-drain region (CDR) comprises a common-drain diffusion region having a shallow heavily-doped diffusion region 318b formed within a deep lightly-doped diffusion region 318a, a pair of second sidewall dielectric spacers 319a being separately formed over each sidewall of the neighboring self-aligned split-gate regions and on a portion of a second flat bed being formed alternately by a common-drain diffusion region and a second etched raised field-oxide layer 304e, a common-drain conductive bus line 320b capped with a second metal-silicide layer 321b, and a second planarized thick-oxide layer 322a being formed over the second metal-silicide layer 321b and the pair of second sidewall dielectric spacers 319a. The shallow heavily-doped diffusion regions 307b, 318b can be formed by using the heavily-implanted common-source/drain conductive bus lines 309b, 320b as the dopant diffusion sources. A first interconnect metal layer 325a is formed over the formed structure and a hard masking layer including a masking dielectric layer 326a and its two sidewall dielectric spacers 327a (see FIG. 2E) is formed over the first interconnect metal layer 325a and is acted as a mask to simultaneously pattern and etch the first interconnect metal layer 325a and the composite control-gate layer for forming a word line.

Figure 2D:
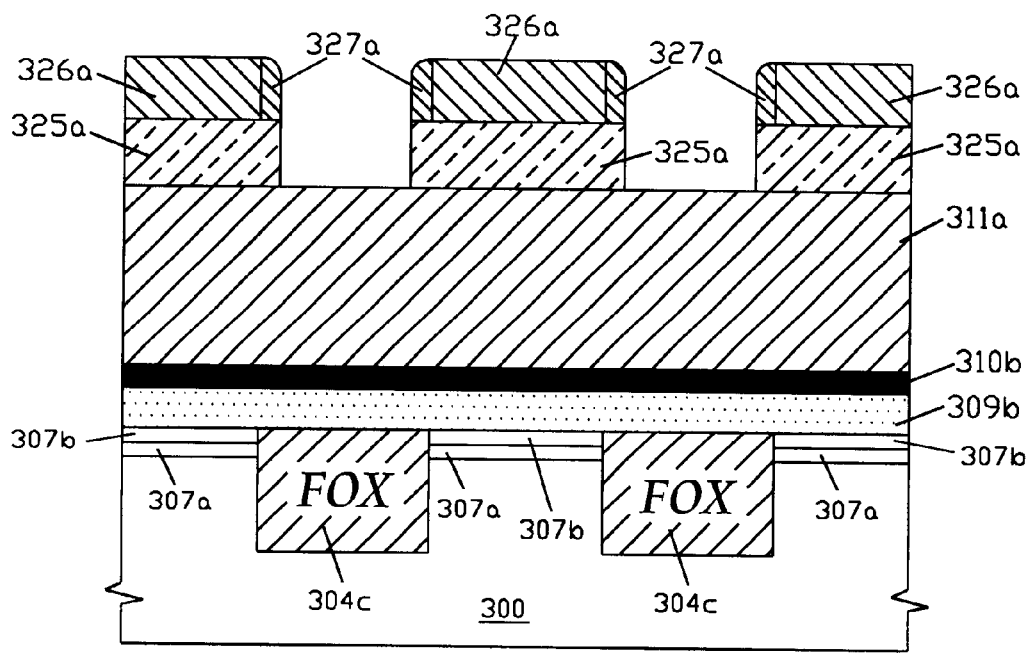

FIG. 2D shows a cross-sectional view along a common-source region (B–B') shown in FIG. 2B, in which a common-source conductive bus line 309b capped with a first metal-silicide layer 310b is formed over a first flat bed being alternately formed by a first etched raised field-oxide layer 304c and a common-source diffusion region having a shallow heavily-doped diffusion region 307b formed within a deep lightly-doped diffusion region 307a. A first planarized thick-oxide layer 311a is formed over the first metal-silicide layer 310b, and a plurality of word lines 325a being formed over the first planarized thick-oxide layer 311a are patterned and etched by a plurality of masking dielectric layers 326a being formed above the plurality of active regions and their sidewall dielectric spacers 327a.

Figure 2E:
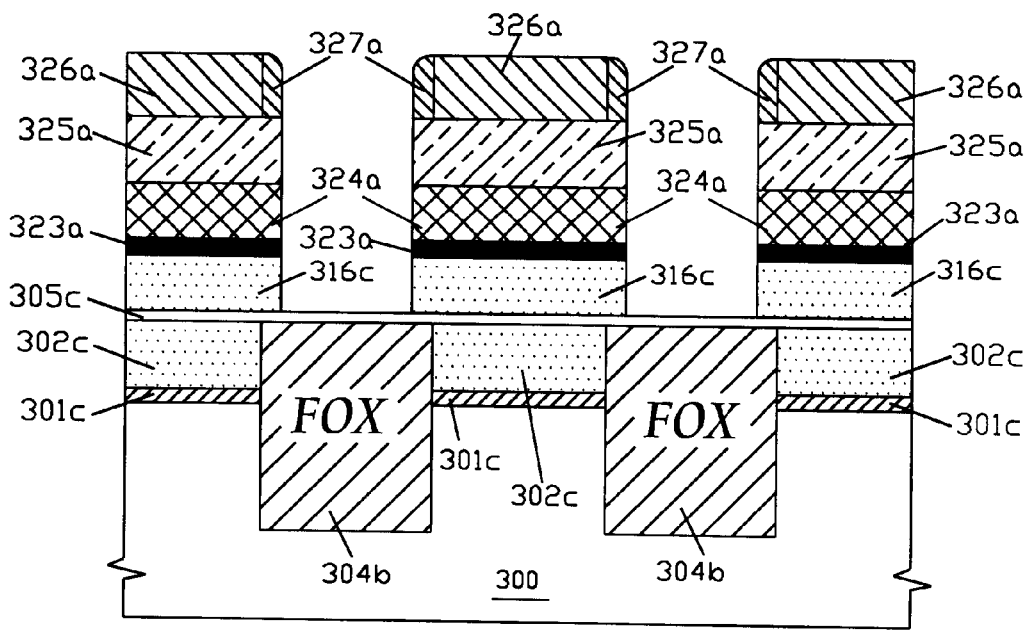

FIG. 2E shows a cross-sectional view along a floating-gate transistor region (C–C') shown in FIG. 2B, in which each of floating-gate layers 302c is formed on a thin tunneling-dielectric layer 301c with its width being defined by the neighboring raised field-oxide layers 304b; an intergate dielectric layer 305c is formed over a flat bed being alternately formed by a raised field-oxide layer 304b and a floating-gate layer 302c; a plurality of composite control-gate (324a, 323a and 316c) being formed in the plurality of floating-gate transistor regions and a plurality of word lines 325a are simultaneously patterned and etched by a set of the hard mask layers as described in FIG. 2D.

Figure 2F:
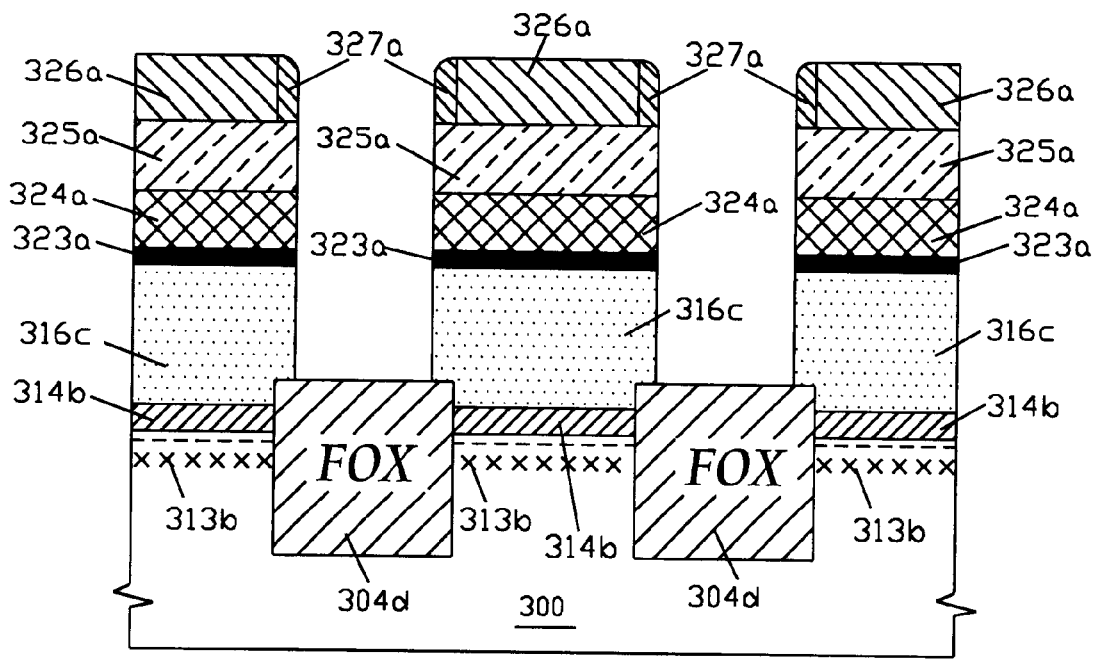

FIG. 2F shows a cross-sectional view along a select-gate transistor region (D–D') shown in FIG. 2B, in which a gate-dielectric layer 314b is formed between the neighboring etched raised field-oxide layers 304d and an implanted region 313b of a first conductivity-type being formed by a shallow implant region (as marked by dash lines) and a deeper implant region (as marked by cross symbols) is located under the gate-dielectric layer 314b; a plurality of composite control-gates (324a, 323a and 316c) being formed in the plurality of select-gate transistor regions and a plurality of word lines 325a are simultaneously patterned and etched by using a plurality of hard masking layers with each hard masking layer being formed by a masking dielectric layer 326a and its two sidewall dielectric spacers 327a.

Figure 2G:
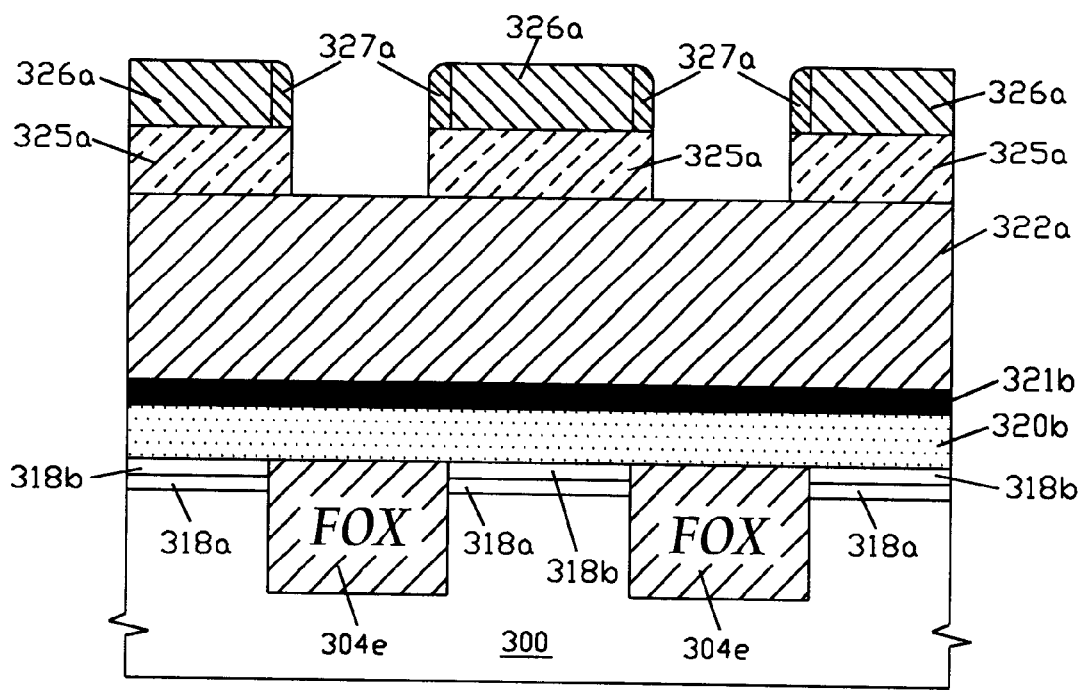

FIG. 2G shows a cross-sectional view along a common-drain region (E–E') shown in FIG. 2B, in which a common-drain conductive bus line 320b capped with a second metal-silicide layer 321b is formed over a second flat bed being alternately formed by a common-drain diffusion region having a shallow heavily-doped diffusion region 318b formed within a lightly-doped diffusion region 318a and a second etched raised field-oxide layer 304e; a second planarized thick-oxide layer 322a is formed over a second metal-silicide layer 321b; and a plurality of word lines 325a being patterned and etched by using a plurality of hard masking layers with each hard masking layer being formed by a masking dielectric layer 326a and its two sidewall dielectric layers 327a.

From FIG. 2E and FIG. 2F, it is clearly seen that the masking dielectric layer 326a is aligned above the active region and its two sidewall dielectric spacers 327a are mainly used to eliminate the misalignment between the masking dielectric layer 326a and the active region. From FIG. 2B, the unit cell of a self-aligned split-gate flash memory cell in an array as marked by a dash square is equal to $(1+X)F^2$, where X is a scaling factor and is preferably $1 \leq X \leq 3$. For example, X=3, the cell size is $4F^2$; X=1, the cell size is $2 F^2$.

As shown in FIG. 2A, a self-aligned split-gate flash memory cell in an array can be programmed and read by a method comprising: a first voltage is applied to a common-source conductive bus line of the selected cell and a second voltage is applied to a common-drain conductive bus line of the selected cell; the second voltage is also applied to the common-source/drain conductive bus lines in the same side of the common-drain conductive bus line and the first voltage is also applied to the common-drain/source bus lines in the same side of the common-source conductive bus line; and a third voltage is applied to a word line of the selected cell and a ground voltage is applied to the other word lines. For programming, the second voltage is 0 volts (grounded), the first voltage is about 3.3~5.0 volts, and the third voltage is slightly larger than the threshold voltage of the select-gate transistor of the selected cell; for reading, the second voltage is 0 volts, the first voltage is about 1.0~1.5 volts, and the third voltage is about 6.0~8.0 volts. It should be noted that the applied voltages for the first voltage and the second voltage can be reversed for reading.

From FIG. 2C(a) and FIG. 2C(b), the self-aligned split-gate flash memory cell can be erased by two methods: stored electrons in the floating-gate are erased to the control-gate through a thin nitrided thermal polyoxide layer being formed over a sidewall or are erased to the common-source diffusion region through a thin tunneling-dielectric layer. Therefore, a first voltage of about 10~14 volts is applied to all of the common-source conductive bus lines and a third voltage of 0 volts (grounded) is applied to a word line to simultaneously erase the cells near the common-source conductive bus lines and under the word line. The other word lines and all of the common-drain conductive bus lines can be applied with the first voltage. By the way, a first voltage of 10~14 volts is applied to all of the common-source/drain conductive bus lines and a third voltage of 0 volts is applied to all of the word lines, all of the cells in an array can be simultaneously erased by tunneling stored electrons in the floating-gate to the common-source diffusion regions of the cells. Similarly, a first voltage of 0 volts is applied to all of the common-source/drain conductive bus lines, a third voltage of 12~18 volts is applied to a word line, and the other word lines are applied with 0 volts (grounded), the cells near the common-source conductive bus lines and under the word line can be simultaneously erased; a first voltage of 0 volts is applied to all of the common-source/drain conductive bus lines and a third voltage of 12~18 volts is applied to all of the word lines, all of the cells in an array can be simultaneously erased by tunneling stored electrons in the floating-gates to the control-gates. It is clearly seen that a single voltage with one polarity is needed to do erasing process.

Based on the above description, the features and advantages of the self-aligned split-gate flash memory cell and its contactless memory array of the present invention can be summarized below:

(a) The contactless self-aligned split-gate flash memory array of the present invention offers the common-source/drain conductive bus lines with much lower bus-line resistance and much lower bus-line parasitic capacitance with respect the semiconductor substrate as compared to the buried diffusion lines of the prior arts.

(b) The contactless self-aligned split-gate flash memory array of the present invention offers a shallow-trench-isolation structure for the cells in different word lines without producing doping encroachment and increasing the parasitic junction capacitances of the common-source/drain conductive bus lines.

(c) The contactless self-aligned split-gate flash memory array of the present invention offers a high-conductivity metal layer for a word line and a lower parasitic capacitances between the word line and the common-source/drain conductive bus lines as compared to the prior arts.

(d) The self-aligned split-gate flash memory cell of the present invention may offer a cell size smaller than $4F^2$.

(e) The self-aligned split-gate flash memory cell in an array of the present invention can be operated with higher read speed and higher programming efficiency without over-erase problem as compared to the stack-gate flash memory cell in a similar array.

Figure 3A:
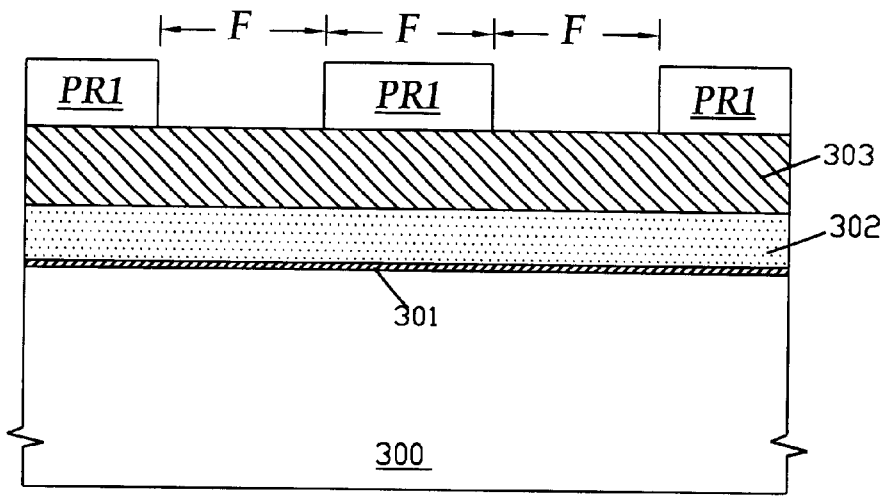
FIG. 3A through FIG. 3F show the process steps and their cross-sectional views of fabricating a shallow-trench-isolation structure for a contactless self-aligned split-gate flash memory array of the present invention.

Referring now to FIG. 3A through FIG. 3F, there are shown the process steps and their cross-sectional views of fabricating a shallow-trench-isolation (STI) structure for a self-aligned split-gate flash memory array of the present invention. FIG. 3A shows that a thin tunneling-dielectric layer 301 is formed over a semiconductor substrate 300 of a first conductivity type; a first conductive layer 302 is formed over the thin tunneling-dielectric layer 301; a first masking dielectric layer 303 is then formed over the first conductive layer 302; and a plurality of patterned masking photoresist PR1 are formed over the first masking dielectric layer 303 to define a plurality of active regions (under PR1) and a plurality of parallel shallow-trench-isolation (STI) regions (between PR1). The thin tunneling-dielectric layer 301 is preferably a thermal-oxide layer or a nitrided thermal-oxide layer and its thickness is preferably between 60 Angstroms and 150 Angstroms. The first conductive layer 302 is preferably a doped polycrystalline-silicon layer or a doped amorphous-silicon layer as deposited by low-pressure chemical-vapor-deposition (LPCVD) and its thickness is preferably between 500 Angstroms to 1500 Angstroms. The first masking dielectric layer 303 is preferably a silicon-nitride layer as deposited by LPCVD and its thickness is preferably between 500 Angstroms and 2000 Angstroms. As shown in FIG. 3A, the width and the space of PR1 can be defined to be a minimum-feature-size (F) of the technology used.

Figure 3B:
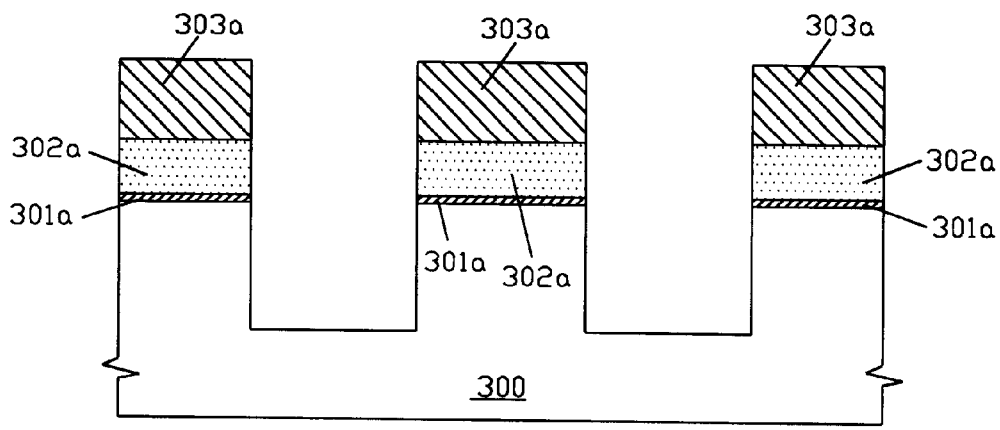

FIG. 3B shows that the first masking dielectric layer 303, the first conductive layer 302, and the thin tunneling-dielectric layer 301 outside of PR1 are anisotropically removed and then the semiconductor substrate 300 is anisotropically etched to form a plurality of shallow trenches, then the patterned masking photoresist PR1 are stripped. The depth of shallow trenches is preferably between 3000 Angstroms and 8000 Angstroms.

Figure 3C:
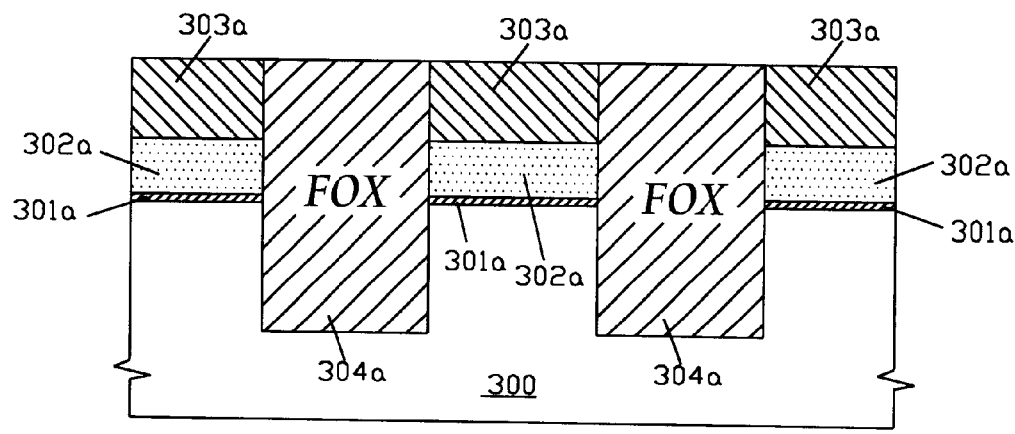

FIG. 3C shows that the planarized field-oxide layers 304a are formed to fill up the gaps. The planarized field-oxide layer 304a is formed by first depositing a thick-oxide layer 304 over the whole structure and then planarizing the deposited thick-oxide layer 304 using chemical-mechanical polishing (CMP) with the first masking dielectric layer 303a as a polishing stop. The planarized field-oxide layer 304a is preferably made of silicon-oxides or phosphosilicate glass (PSG), as deposited by high-density plasma CVD or CVD.

Figure 3D:
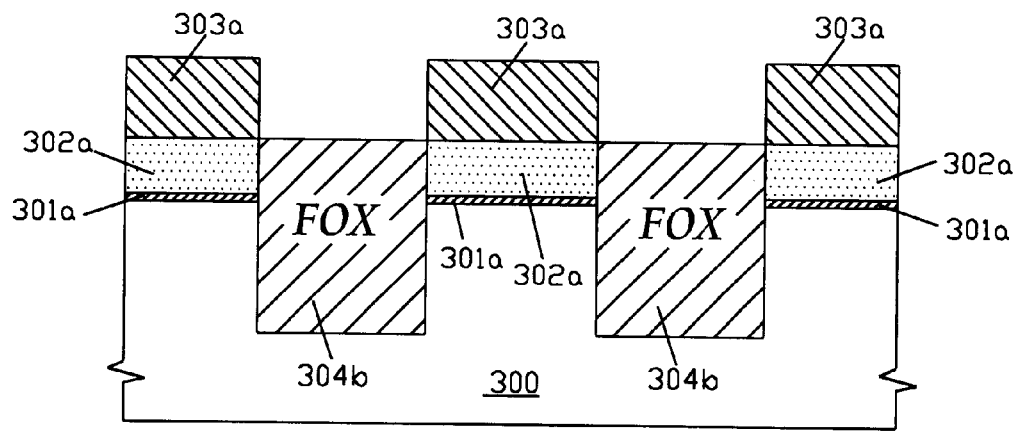

FIG. 3D shows that the planarized field-oxide layers 304a are anisotropically etched back to a depth approximately equal to the thickness of the first masking dielectric layer 303a to form the raised field-oxide layers 304b.

Figure 3E:
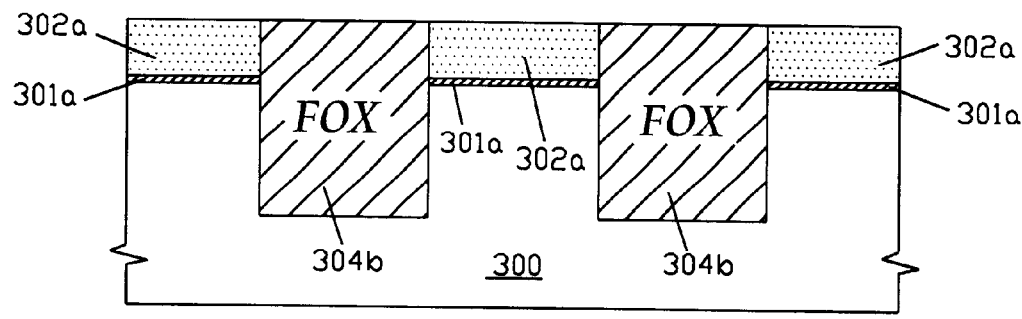

FIG. 3E shows that the first masking dielectric layers 303a are removed by using hot-phosphoric acid or anisotropic dry etching.

Figure 3F:
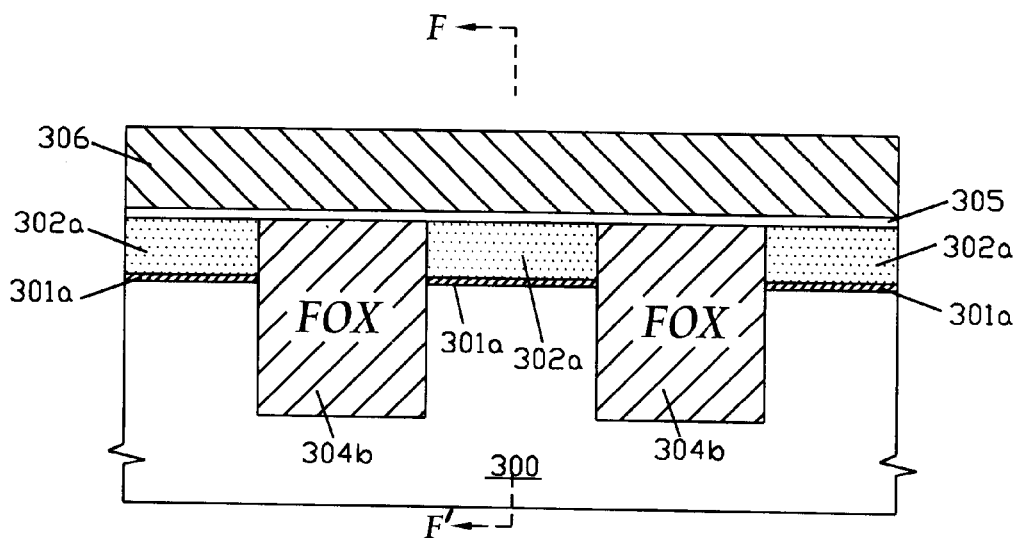

FIG. 3F shows that an intergate dielectric layer 305 is formed over a flat surface being alternately formed by a raised field-oxide layer 304b and a first conductive layer 302a and then a second masking dielectric layer 306 is formed over the intergate dielectric layer 305. The intergate dielectric layer 305 is preferably a silicon-oxide layer or an oxide-nitride-oxide (ONO) structure. The silicon-oxide layer is preferably formed by high-temperature-oxide (HTO) deposition or is a thermal poly-oxide layer and its thickness is preferably between 100 Angstroms and 300 Angstroms. The equivalent oxide thickness of an oxide-nitride-oxide structure is preferably between 80 Angstroms and 200 Angstroms. The second masking dielectric layer 306 is preferably a silicon-nitride layer as deposited by LPCVD and its thickness is preferably between 3000 Angstroms and 5000 Angstroms. It should be emphasized that the surface shown in FIG. 3F is formed to be flat for fine-line lithography later on. A cross-section view along the active region (F–F') shown in FIG. 3F is shown in FIG. 4A.

Figure 4A:
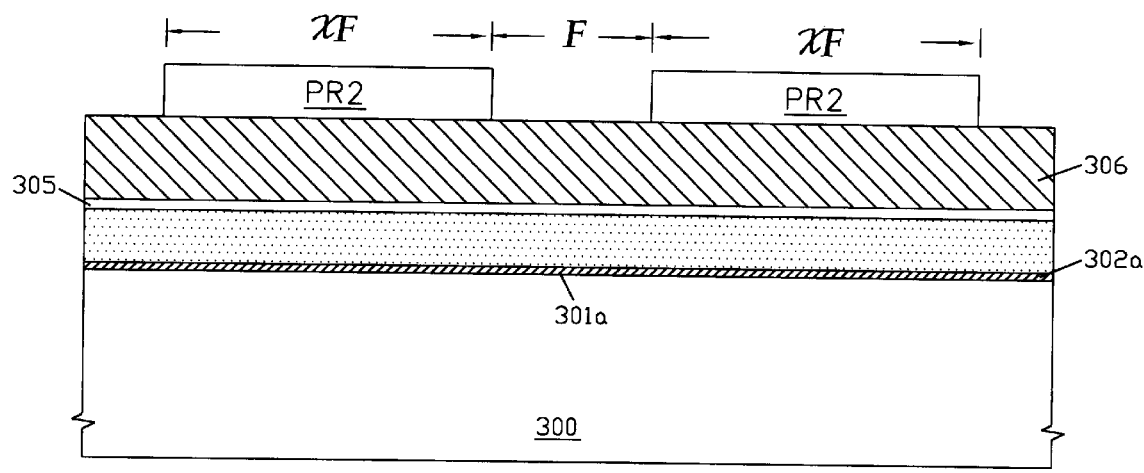
FIG. 4A through FIG. 4R show the process steps and their cross-sectional views for forming a contactless self-aligned split-gate flash memory array of the present invention.
Figure 4B:
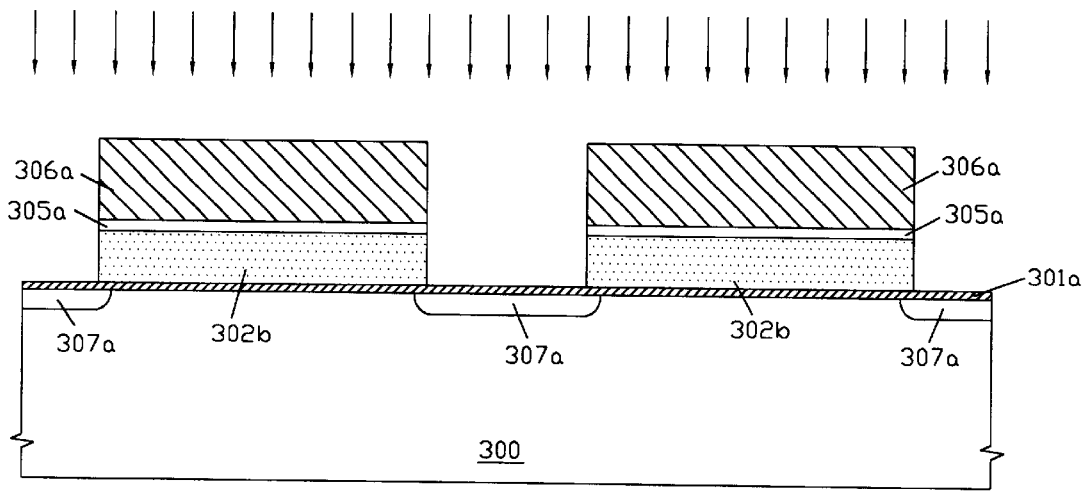
Figure 4C:
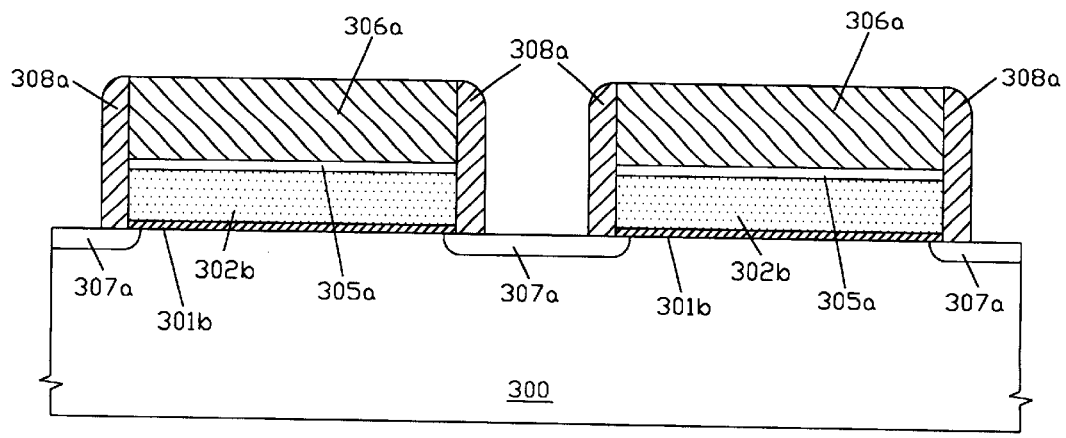
Figure 4D:
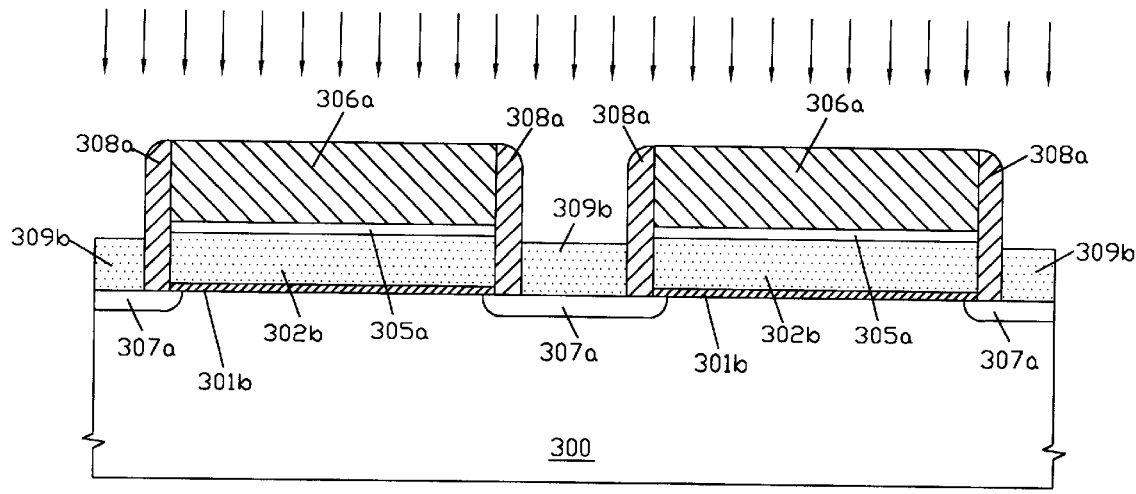
Figure 4E:
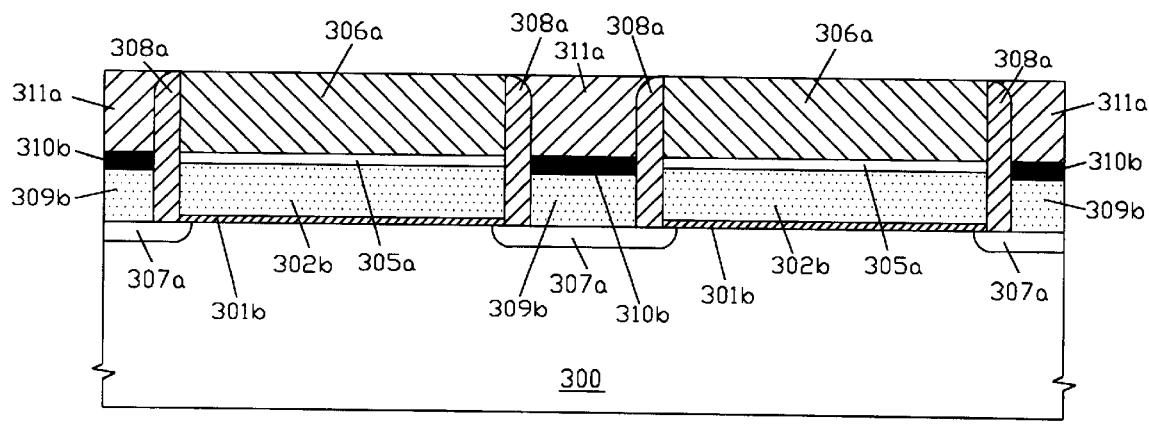
Figure 4F:
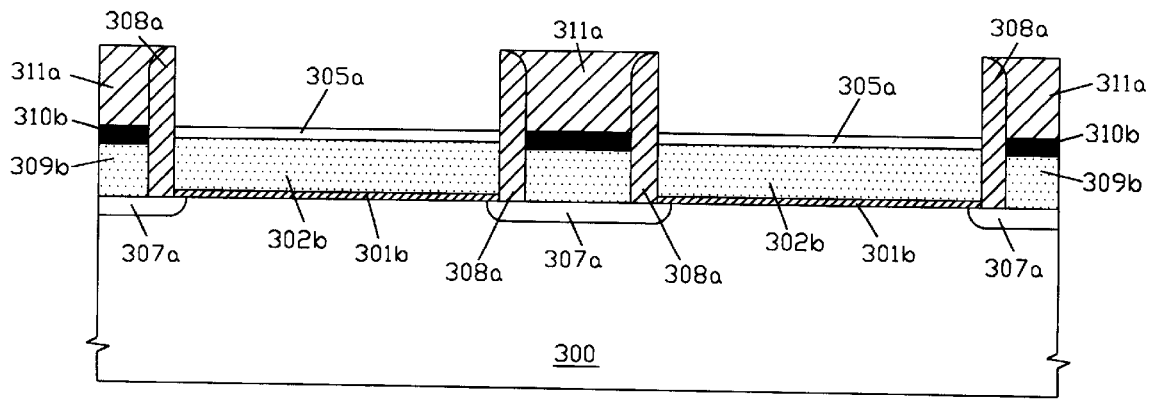
Figure 4G:
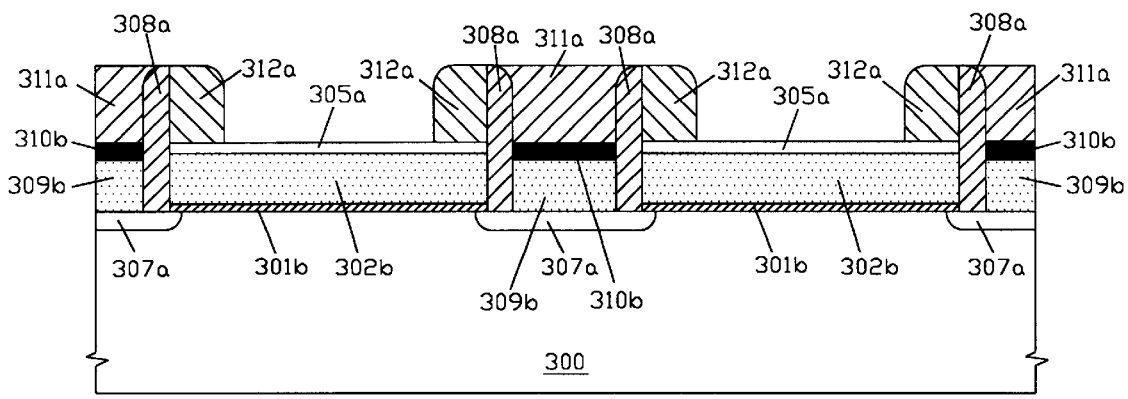
Figure 4H:
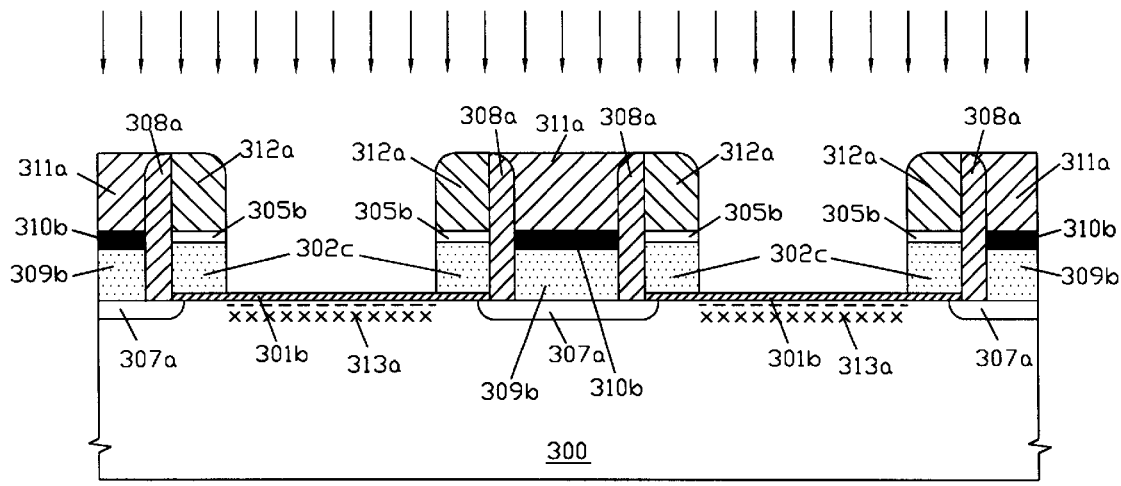
Figure 4I:
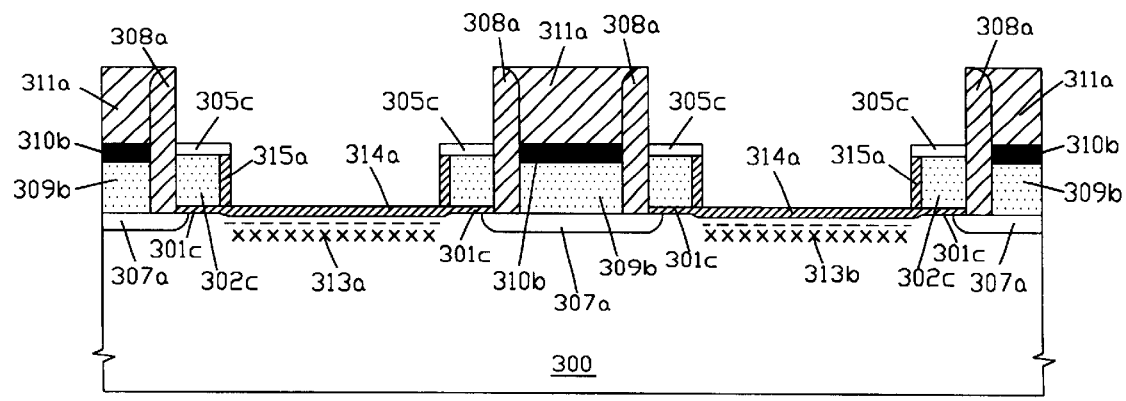
Figure 4J:
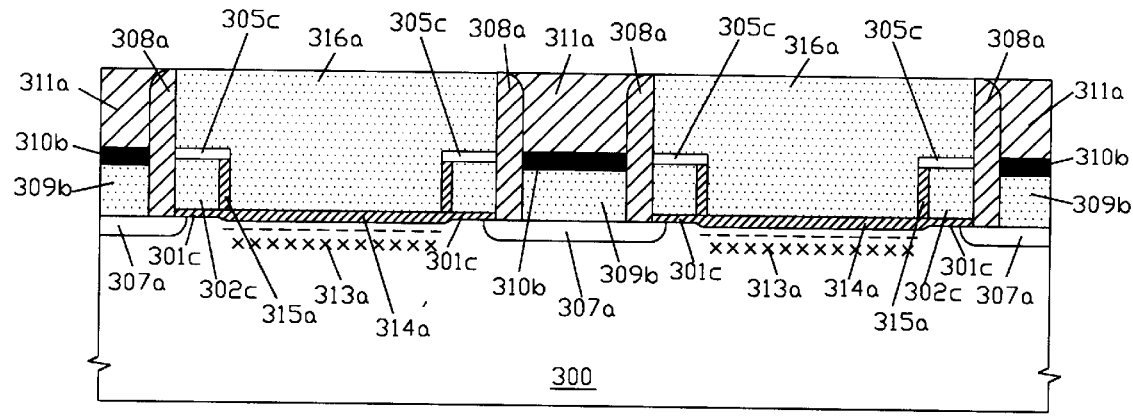
Figure 4K:
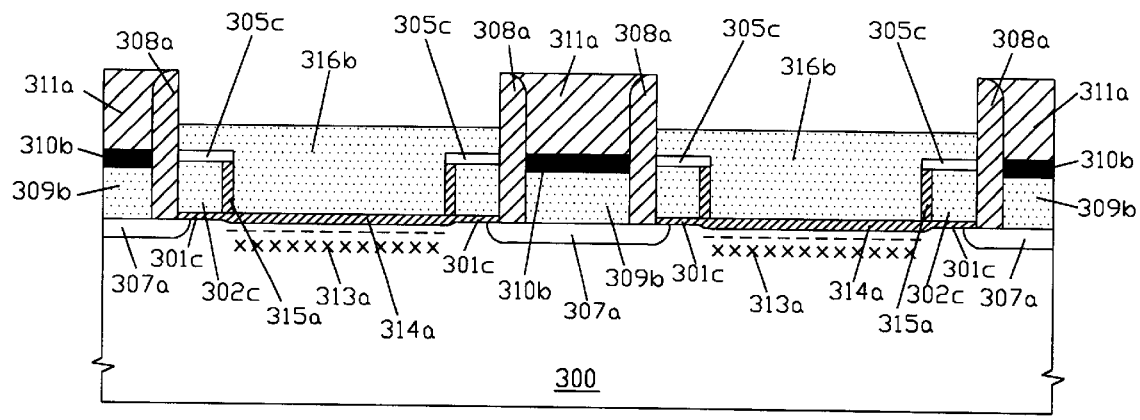
Figure 4L:
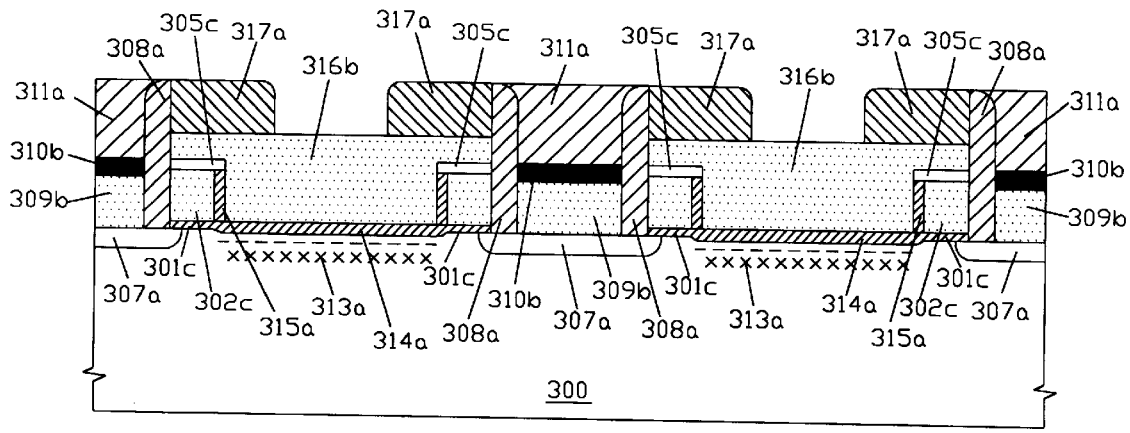
Figure 4M:
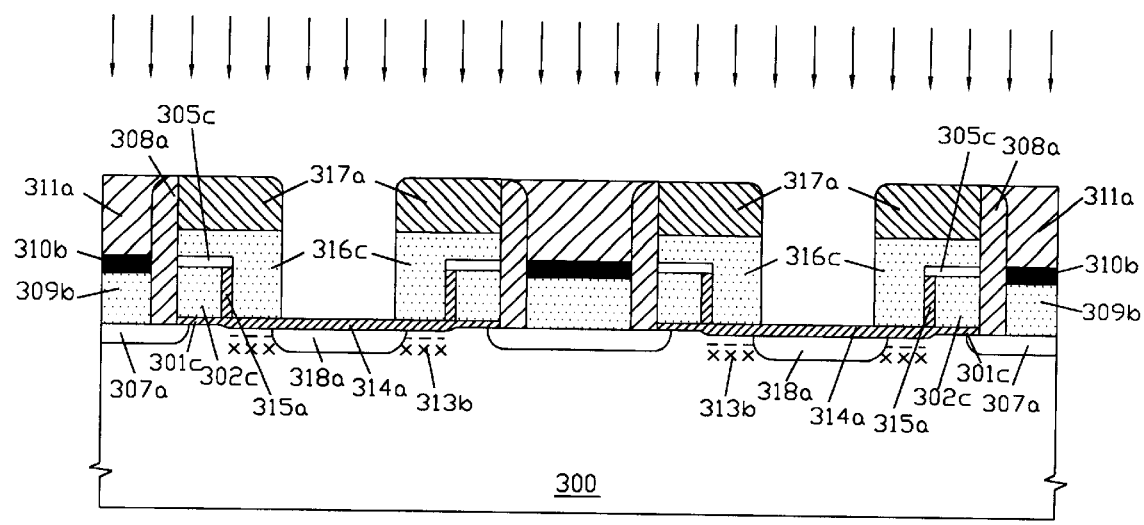
Figure 4N:
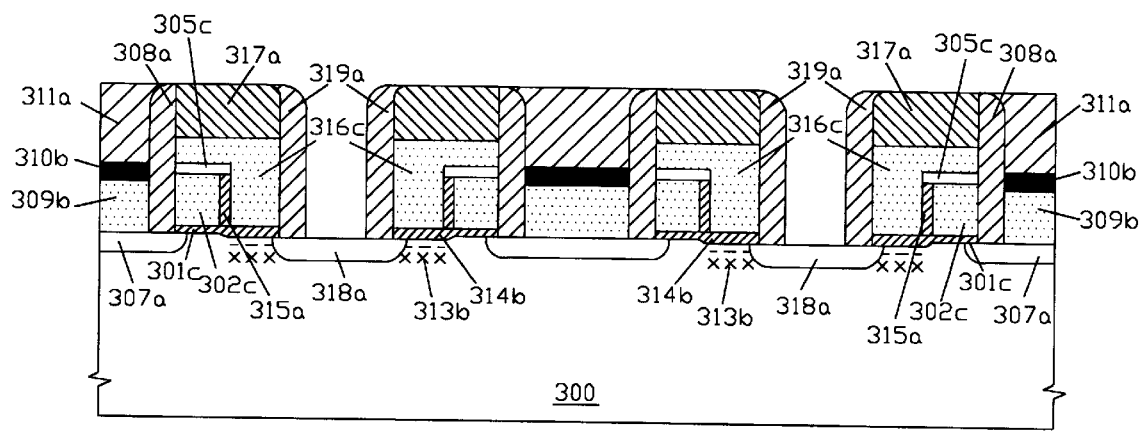
Figure 4O:
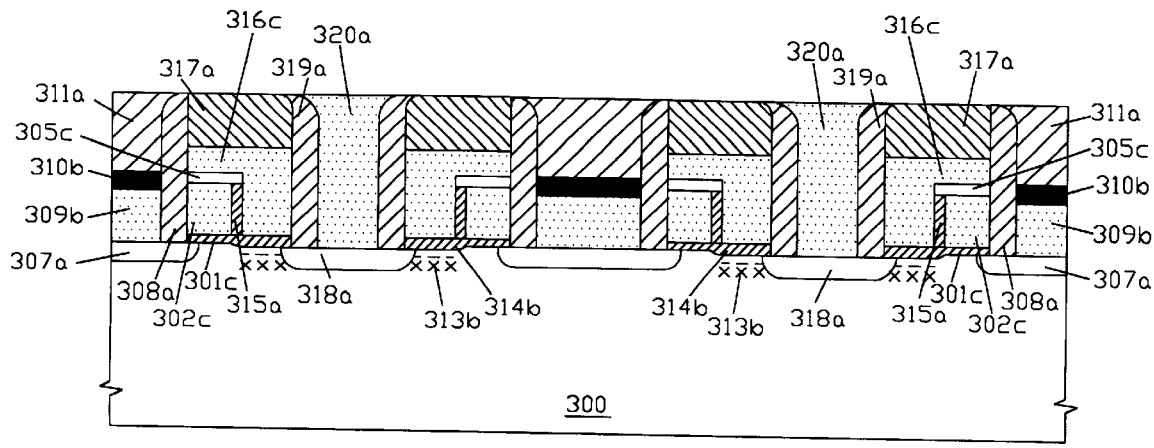
Figure 4P:
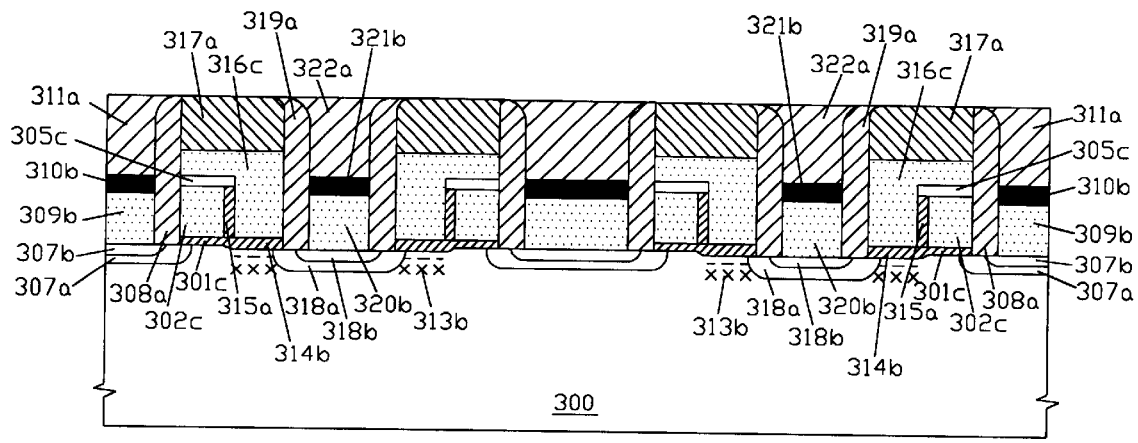
Figure 4Q:
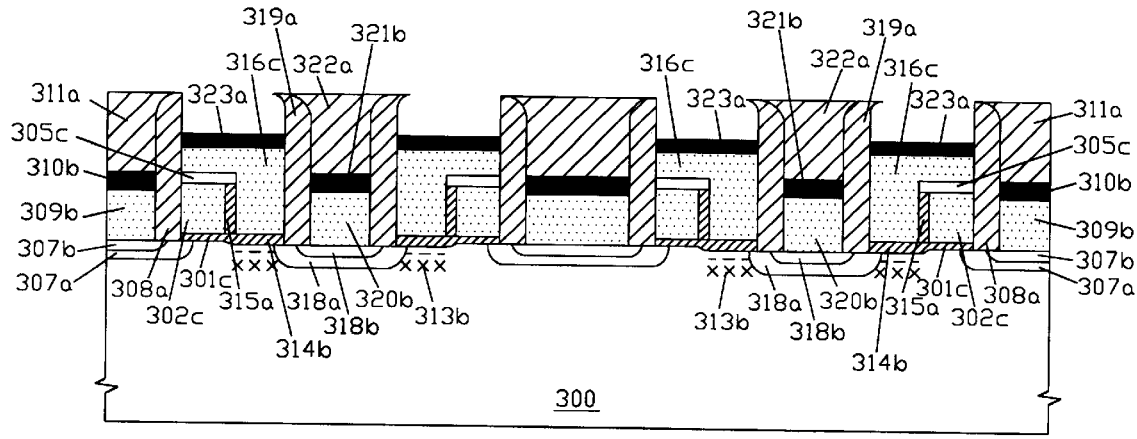
Figure 4R:
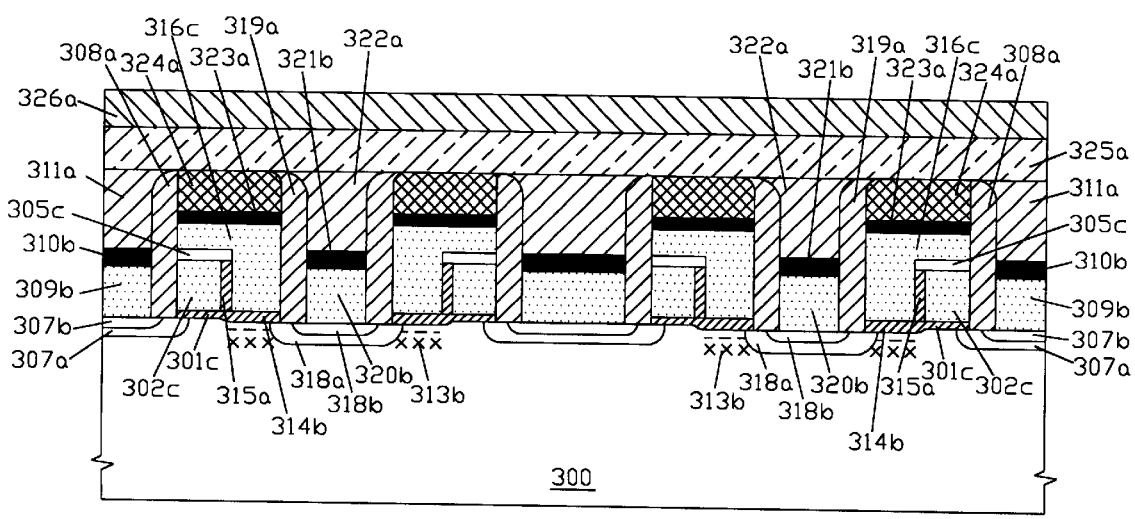

Referring now to FIG. 4A through FIG. 4R, there are shown the process steps and their cross-sectional views for fabricating a self-aligned split-gate flash memory array of the present invention. FIG. 4A shows that a plurality of patterned masking photoresist PR2 are formed over the second masking dielectric layer 306 to define a plurality of virtual gate regions (VGR) being formed under PR2 and a plurality of common-source regions (CSR) being formed between PR2. The width of a virtual gate region is XF and is scalable; the width of a common-source region is preferably a minimum-feature-size F.

FIG. 4B shows that the second masking dielectric layer 306 and the intergate dielectric layer 305 outside of PR2 are anisotropically removed first, then the raised field-oxide layers 304b are etched back to a level approximately equal to the top surface of the thin tunneling-dielectric layer 301a, and the first conductive layers 302a are subsequently removed by anisotropic dry etching, then the patterned masking photoresist PR2 are stripped. An ion-implantation is performed by implanting doping impurities across the thin tunneling-dielectric layer 301a into the semiconductor substrate 300 in a self-aligned manner to form a plurality of common-source diffusion regions 307a of a second conductivity type. The common-source diffusion region 307a can be lightly-doped or heavily-doped.

FIG. 4C shows that the thin tunneling-dielectric layer 301a is removed by dipping in dilute hydrofluoric acid and the etched raised field-oxide layer is also etched to form a first flat bed being alternately formed by a common-source diffusion region 307a and a first etched raised field-oxide layer 304c, and a pair of first sidewall dielectric spacers 308a are then formed over the sidewalls of the neighboring virtual gate regions and on a portion of the first flat bed. The first sidewall dielectric spacer 308a is formed by first depositing a dielectric layer 308 over the formed structure and then etching back the thickness of the deposited dielectric layer 308. The first sidewall dielectric layer 308a is preferably made of silicon-oxides as deposited by LPCVD and the spacer width is preferably between 200 Angstroms and 1000 Angstroms.

FIG. 4D shows that the planarized second conductive layers 309a are formed over the gaps between the pair of first sidewall dielectric spacers 308a and on the first flat beds and are then etched back to a level slightly tower than the top surface of the first conductive layer 302b, and subsequently an ion-implantation is performed by implanting a high dose of doping impurities into the etched-back second conductive layers 309b in a self-aligned manner. The planarized second conductive layer 309a is preferably made of doped polycrystalline-silicon as deposited by LPCVD and is formed by first depositing a thick second conductive layer 309 over the formed structure and then planarizing the deposited thick second conductive layer 309 using CMP with the second masking dielectric layer 306a as a polishing stop. It should be noted that the heavily implanted etched-back second conductive layer 309b is acted as a dopant diffusion source to form a shallow heavily-doped diffusion region 307b within a common-source diffusion region 307a later (see FIG. 4P).

FIG. 4E shows that a first metal-silicide layer 310b is formed over the etched-back second conductive layer 309b and a planarized thick-oxide layer 311a is then formed over the first metal-silicide layer 310b and the pair of first sidewall dielectric spacers 308a. The first metal-silicide layer 310b is formed by the well-known self-aligned silicidation process or is formed by first depositing a planarized metal-silicide layer 310a and then etching back the deposited planarized metal-silicide layer 310a. The first metal-silicide layer 310b is preferably made of tungsten-silicides or high melting-point metal-silicides. The planarized thick-oxide layer 311a is preferably made of silicon-oxides as deposited by LPCVD or high-density plasma CVD.

FIG. 4F shows that the second masking dielectric layers 306a are removed by using hot-phosphoric acid.

FIG. 4G shows that a pair of third sidewall dielectric spacers 312a are formed over the sidewalls being formed by the removed second masking dielectric layers 306a to define the floating lengths in each of virtual gate regions. The third sidewall dielectric spacer 312a is preferably made of silicon-nitrides as deposited by LPCVD and is formed by first depositing a dielectric layer 312 and then etching back the thickness of the deposited dielectric layer 312. Therefore, the spacer width can be controlled by the thickness of the deposited dielectric layer 312 and can be made to be much smaller than a minimum-feature-size (F) of technology used.

FIG. 4H shows that the intergate dielectric layers 305a and the first conductive layers 302b between the pair of third sidewall dielectric spacers 312a are anisotropically removed in sequence to form a steep floating-gate structure or a one-side tapered floating-gate structure and the raised field-oxide layers 304b between the pair of third sidewall dielectric spacers 312a are slightly etched. An ion-implantation is performed by implanting doping impurities across the thin tunneling-dielectric layers 301b into the semiconductor substrate in a self-aligned manner to form an implanted region 313a of a first conductivity type. The implanted region 313a includes a shallow implant region (as marked by dash lines) for threshold-voltage adjustment and a deep implant region for forming a punch- through stop (as marked by cross symbols).

FIG. 4I shows that the thin tunneling-dielectric layers 301b between the pair of third dielectric spacers 312a are removed by dipping in dilute hydrofluoric acid and the pair of third sidewall dielectric spacers 312a are then removed by using hot-phosphoric acid. Subsequently, a thermal oxidation is performed to form a gate-oxide layer 314a over the semiconductor substrate 300, a first thermal poly-oxide layer 315a over a sidewall of the first conductive layer 302c, and a thicker intergate dielectric layer 305c. It should be noted that the gate-oxide layer 314a, the first thermal poly-oxide layer 315a and the thicker intergate dielectric layer 305c are preferably nitrided in a $N_2O$ ambient. The thickness of the first thermal poly-oxide layer 315a is preferably between 150 Angstroms and 300 Angstroms and the thickness of the gate-oxide layer 314a is preferably between 100 Angstroms and 250 Angstroms.

FIG. 4J shows that the planarized third conductive layers 316a are formed to fill up the gaps between the neighboring common-source regions. The planarized third conductive layer 316a can be made of doped polycrystalline-silicon or metal materials. The preferred metal materials are tungsten-silicide or tungsten formed on a thin buffer metal layer such as titanium-nitride (TiN) or tantalum-nitride (TaN) as a liner.

FIG. 4K shows that the planarized third conductive layers 316a are etched back to a level approximately between 2000 Angstroms and 4000 Angstroms.

FIG. 4L shows that a pair of fourth sidewall dielectric spacers 317a are formed over the sidewalls of the neighboring common-source regions and on the etched-back planarized third conductive layer 316b.The fourth sidewall dielectric spacer 317a is preferably made of silicon-nitrides as deposited by LPCVD and its spacer width is used to define the control-gate length of each of self-aligned split-gate flash memory cells. The control-gate length can be made to be smaller than a minimum-feature-size of technology used.

FIG. 4M shows that the etched-back planarized third conductive layers 316b between the pair of fourth sidewall dielectric spacers 317a are partially etched and the etched raised field-oxide layers are etched back to a level approximately equal to the top surface of the gate-oxide layer 314a, and the remained third conductive layers are anisotropically removed. Subsequently, an ion-implantation is performed by implanting doping impurities into the semiconductor substrate 300 in a self-aligned manner to form the common-drain diffusion regions 318a of a second conductivity type. The common-drain diffusion region 318a can be lightly-doped or heavily-doped.

FIG. 4N shows that the gate-oxide layers 314a between the pair of fourth sidewall dielectric spacers 317a are removed by dipping in dilute hydrofluoric acid and the etched raised field-oxide layers are further etched to form a second flat bed being formed alternately by a common-drain diffusion region 318a and a second etched raised field-oxide layer 304e, and a pair of second sidewall dielectric spacers 319a are separately formed over the sidewalls of the control-gate regions and on a portion of the second flat bed. The second sidewall dielectric spacer 319a is preferably made of silicon-oxides as deposited by LPCVD.

FIG. 4O shows that the planarized fourth conductive layers 320a are formed over the gaps between the pair of second dielectric spacers 319a and on the second flat beds. The planarized fourth conductive layer 320a is preferably made of doped polycrystalline-silicon as deposited by LPCVD.

FIG. 4P shows that the planarized fourth conductive layers 320a are etched back to a level slightly lower than the top surface of the intergate dielectric layer 305c and an ion-implantation is then performed (not shown) by implanting a high dose of doping impurities into the etched-back planarized fourth conductive layers 320b to be acted as the dopant diffusion sources for forming a shallow heavily-doped diffusion region 318b of a second conductivity type within the common-drain diffusion region 318a. Similarly, a second metal-silicide layer 321b is then formed over the etched-back planarized fourth conductive layer 320b and, subsequently, the second planarized thick-oxide layer 322a is formed over the second metal-silicide layer 321b and the pair of second sidewall dielectric spacers 319a.

FIG. 4Q shows that the fourth sidewall dielectric spacers 317a are selectively removed by using hot-phosphoric acid and a self-aligned silicidation process is performed to form a third metal-silicide layer 323a over the etched-back planarized polycrystalline-silicon layer 316c. If the etched-back planarized third conductive layer 316c is made of tungsten-silicides or tungsten, the third metal-silicide layer 323a is not required. The third metal-silicide layer 323a is preferably made of refractory-metal silicides such as titanium-silicide ($TiSi_2$), cobalt-silicide ($CoSi_2$), tantalum-silicide ($TaSi_2$), molybdenum-silicide ($MoSi_2$), nickle-silicide ($NiSi_2$), platinum-silicide ($PtSi_2$), or tungsten-silicide ($WSi_2$).

FIG. 4R shows that the planarized fifth conductive layers 324a are formed over the third metal-silicide layers 323a, a first interconnect metal layer 325 is deposited over the formed structure, and a set of hard masking layers with a hard masking layer including a third masking dielectric layer 326a and its two sidewall dielectric spacers 327a are formed over the first interconnect metal layer 325 to simultaneously pattern and etch the first interconnect metal layer 325, the planarized fifth conductive layers 324a, the third metal-silicide layers 323a, and the planarized third conductive layers 316c to form a plurality of word lines being perpendicular to the common-source/drain conductive bus lines, as shown in FIG. 2B. The planarized fifth conductive layer 324a is preferably made of tungsten; the first interconnect metal layer 325a is preferably an aluminum or copper layer being formed on a barrier-metal layer such as titanium-nitrides or tantalum-nitrides; and the hard masking layer is preferably made of silicon-nitrides or silicon-oxides as deposited by LPCVD. The cross-sectional views of a contactless self-aligned flash memory array of the present invention are separately shown in FIG. 2D through FIG. 2G. It should be emphasized that the first/second metal-silicide layers 310b, 321b can be deleted if higher conductivity of common-source/drain conductive bus lines aren't required.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A self-aligned split-gate flash memory cell, comprising:

a semiconductor substrate of a first conductivity type;

a cell region having an active region and two shallow-trench-isolation regions formed on said semiconductor substrate and being divided into three regions: a common-source region, a gate region, and a common-drain region, wherein said gate region is located between said common-source region and said common-drain region with its control-gate length being defined by a fourth sidewall dielectric spacer being formed over a sidewall of said common-source region and said shallow-trench-isolation region is filled with a raised field-oxide layer;

a common-source diffusion region of a second conductivity type being formed in said semiconductor substrate by implanting doping impurities in a self-aligned manner into said active region in said common-source region;

a first flat bed being formed by said common-source diffusion region and nearby first etched raised field-oxide layers and a first sidewall dielectric spacer being formed over a sidewall of said gate region;

a common-source conductive layer being formed over said first flat bed outside of said first sidewall dielectric spacer and a first planarized thick-oxide layer being formed over said common-source conductive layer and said first sidewall dielectric spacer;

a common-drain diffusion region of a second conductivity type being formed in said semiconductor substrate by implanting doping impurities in a self-aligned manner into said active region in said common-drain region;

a second flat bed being formed by said common-drain diffusion region and nearby second etched raised field-oxide layers and a second sidewall dielectric spacer being formed over another sidewall of said gate region;

a common-drain conductive layer being formed over said second flat bed outside of said second sidewall dielectric spacer and a second planarized thick-oxide layer being formed over said common-drain conductive layer and said second sidewall dielectric spacer; and a self-aligned split-gate structure being formed in said gate region with a planarized control-gate being formed on the top and being divided into two subregions: a floating-gate region being formed near said common-source region and a select-gate region being formed near said common-drain region, wherein said floating-gate region comprises a floating-gate transistor being formed on a thin tunneling-dielectric layer with a floating-gate length being defined by a third sidewall dielectric spacer formed over said sidewall of said common-source region and said select-gate region comprises a select-gate transistor being formed over a gate-dielectric layer.

2. The self-aligned split-gate flash memory cell according to claim 1, wherein said floating-gate is etched to form a steep sidewall or an one-side tapered sidewall having an intergate dielectric layer formed on its top and a nitrided thermal poly-oxide layer formed on said steep sidewall or said one-side tapered sidewall, and said nitrided thermal polyoxide layer is acted as a tunneling-dielectric layer to erase stored electrons in said floating-gate to said planarized control-gate.

3. The self-aligned split-gate flash memory cell according to claim 1, wherein said common-source/drain conductive layer is made of doped polycrystalline-silicon and is further heavily implanted with a high dose of doping impurities to be acted as a dopant diffusion source for forming a shallow heavily-doped diffusion region of a second conductivity type within said common-source/drain diffusion region, and said common source/drain conductive layer is capped with a first/second metal-silicide layer.

4. The self-aligned split-gate flash memory cell according to claim 1, wherein an implanted region is formed under said gate-dielectric layer and comprises a shallow implant region of said first conductivity type for threshold-voltage adjustment and a deep implant region of said first conductivity type for forming a punch-through stop.

5. The self-aligned split-gate flash memory cell according to claim 1, wherein said first sidewall dielectric spacer and said second sidewall dielectric spacer are made of silicon-oxides as deposited by low-pressure chemical-vapor-deposition (LPCVD), and said third sidewall dielectric spacer and said fourth sidewall dielectric spacer are made of silicon-nitrides as deposited by LPCVD.

6. The self-aligned split-gate flash memory cell according to claim 1, wherein said common-source diffusion region and said common-drain diffusion region are a lightly-doped diffusion region, a moderately-doped diffusion region, or a heavily-doped diffusion region.

7. The self-aligned split-gate flash memory cell according to claim 1, wherein a metal-layer being formed over said first planarized thick-oxide layer, said planarized control-gate, and said second planarized thick-oxide layer is patterned by a masking dielectric layer being formed above said active region and its two sidewall dielectric spacers to simultaneously etch said metal layer and said planarized control gate for forming a word line transversely to said common-source/drain conductive layers, and said masking dielectric layer and said two sidewall dielectric spacers are made of silicon-nitrides or silicon-oxides as deposited by LPCVD.

8. A contactless self-aligned split-gate flash memory array, comprising a semiconductor substrate of a first conductivity type;

a plurality of parallel shallow-trench-isolation (STI) regions and a plurality of active regions being formed alternately on said semiconductor substrate, wherein each of the plurality of parallel STI regions is filled with a raised field-oxide layer and each of the plurality of active regions is filled with a floating-gate layer being formed over a thin tunneling-dielectric layer;

a plurality of virtual gate regions and a plurality of common-source bus-line regions being formed alternately over said semiconductor substrate and transversely to the plurality of parallel STI regions, wherein the plurality of virtual gate regions are patterned by a masking photoresist step and are therefore scalable;

a plurality of common-source diffusion regions of a second conductivity type being formed by implanting doping impurities in a self-aligned manner into said semiconductor substrate in the plurality of active regions along the plurality of common-source bus-line regions;

a first flat bed being formed in each of the plurality of common-source bus-line regions and being alternately formed by said common-source diffusion region and a first etched raised field-oxide layer, wherein a pair of first sidewall dielectric spacers are separately formed over each sidewall of nearby said virtual gate regions and on a portion of said first flat bed, and each of the plurality of common-source bus-line regions comprises from top to bottom a first planarized thick-oxide layer being formed over said pair of first sidewall dielectric spacers and a common-source conductive bus line being formed over said first flat bed between said pair of first sidewall dielectric spacers;

a self-aligned split-gate region being formed in each side portion of said virtual gate region and a common-drain region being formed between said self-aligned split-gate regions, wherein said self-aligned split-gate region is defined by a fourth sidewall dielectric spacer being formed over a sidewall of said common-source bus-line region and is divided into two subregions: a floating-gate region being formed near said common-source bus-line region and a select-gate region being formed near said common- drain region, and said floating-gate region comprises a plurality of floating- gate transistors with each of the plurality of floating-gate transistors being formed on said thin tunneling-dielectric layer and said select-gate region comprises a plurality of select-gate transistors with each of the plurality of select-gate transistors being formed on a gate-dielectric layer;

a second flat bed being formed in each of the plurality of common-drain regions and being alternately formed by said common-drain diffusion region and a second etched raised field-oxide layer, wherein a pair of second sidewall dielectric spacers are formed over each sidewall of nearby said self-aligned split-gate regions and on a portion of said second flat bed, and each of the plurality of common-drain regions comprises from top to bottom a second planarized thick-oxide layer being formed over said pair of second sidewall dielectric spacers and a common-drain conductive bus line being formed over said second flat bed between said pair of second sidewall dielectric spacers; and a plurality of word lines being formed alternately above the plurality of active regions and transversely to the plurality of common-source/drain conductive bus lines and being electrically connected with said planarized control-gates along the plurality of active regions, wherein each of the plurality of word lines is formed by a metal layer together with said planarized control gates being simultaneously patterned and etched by a masking dielectric layer being located above said active region and its two sidewall dielectric spacers.

9. The contactless self-aligned split-gate flash memory array according to claim 8, wherein said floating-gate layer in each of the plurality of floating-gate transistors is patterned by a third sidewall dielectric spacer being formed on said first sidewall dielectric spacer in said common-source bus-line region to have a floating gate with a steep sidewall or an one-side tapered sidewall and said floating gate has an intergate dielectric layer being formed on its top and a nitrided thermal poly-oxide layer being formed over its sidewall.

10. The contactless self-aligned split-gate flash memory array according to claim 8, wherein said common-source/drain conductive bus line is made of doped polycrystalline-silicon as deposited by LPCVD and is further heavily-doped by implanting a high dose of doping impurities to be acted as a dopant diffusion source for forming a shallow heavily-doped diffusion region of a second conductivity type within said common-source/drain diffusion region and said common-source/drain conductive bus line is capped with a first/second metal-suicide layer.

11. The contactless self-aligned split-gate flash memory array according to claim 8, wherein an implanted region is formed under said gate-dielectric layer and comprises a shallow implant region of said first conductivity type for threshold-voltage adjustment and a deep implant region of said first conductivity type for forming a punch-through stop.

12. The contactless self-aligned split-gate flash memory array according to claim 8, wherein said first/second sidewall dielectric spacer is made of silicon-oxides as deposited by LPCVD, and said third/fourth sidewall dielectric spacer is made of silicon-nitrides as deposited by LPCVD.

13. The contactless self-aligned split-gate flash memory array according to claim 8, wherein said common-source/drain diffusion region is a lightly-doped diffusion region, a moderately-doped diffusion region, or a heavily-doped diffusion region.

14. The contactless self-aligned split-gate flash memory array according to claim 8, wherein said metal layer is an aluminum layer or a copper layer being formed on a barrier-metal layer such as titanium-nitrides (TiN) or tantalum-nitrides (TaN), and said masking dielectric layer and said two sidewall dielectric spacers are made of silicon-oxides or silicon-nitrides as deposited by LPCVD.

* * * * *